United States Patent [19]

Seeser et al.

[11] Patent Number: 5,618,388
[45] Date of Patent: *Apr. 8, 1997

[54] GEOMETRIES AND CONFIGURATIONS FOR MAGNETRON SPUTTERING APPARATUS

[75] Inventors: James W. Seeser; Thomas H. Allen, both of Santa Rosa, Calif.; Eric R. Dickey, Northfield, Minn.; Bryant P. Hichwa, Santa Rosa, Calif.; Rolf F. Illsley, Santa Rosa, Calif.; Robert F. Klinger, Rohnert Park, Calif.; Paul M. LeFebvre, Santa Rosa, Calif.; Michael A. Scobey, Santa Rosa, Calif.; Richard I. Seddon, Santa Rosa, Calif.; David L. Soberanis, Santa Rosa, Calif.; Michael D. Temple, Santa Rosa, Calif.; Craig C. Van Horn, Sebastopol, Calif.; Patrick R. Wentworth, Santa Rosa, Calif.

[73] Assignee: Optical Coating Laboratory, Inc., Santa Rosa, Calif.

[*] Notice: The term of this patent shall not extend beyond the expiration date of Pat. No. 4,851,095.

[21] Appl. No.: 317,781

[22] Filed: Oct. 4, 1994

Related U.S. Application Data

[63] Continuation of Ser. No. 88,401, Jul. 6, 1993, abandoned, which is a continuation of Ser. No. 785,230, Oct. 24, 1991, abandoned, which is a continuation of Ser. No. 435,965, Nov. 13, 1989, abandoned, which is a continuation-in-part of Ser. No. 374,484, Jun. 30, 1989, abandoned, which is a continuation of Ser. No. 154,177, Feb. 8, 1988, Pat. No. 4,851,095.

[51] Int. Cl.⁶ ................................................ C23C 14/34
[52] U.S. Cl. ............... 204/192.12; 118/719; 118/723 R; 118/730; 204/192.26; 204/298.26; 204/298.28; 204/298.19; 427/539; 427/551
[58] Field of Search ................. 204/192.12, 192.26, 204/298.16, 298.19, 298.2, 298.21, 298.22, 298.23, 298.24, 298.28; 118/719, 723 R, 730; 427/539, 535, 533, 551, 553, 537

[56] References Cited

U.S. PATENT DOCUMENTS

| | | | |
|---|---|---|---|
| 3,546,091 | 12/1970 | Rossner et al. | 204/298.29 |
| 3,576,729 | 4/1971 | Sigournay et al. | 204/298.28 X |
| 3,635,811 | 1/1972 | Lane | 204/192 |
| 3,829,373 | 8/1974 | Kuehnle | 204/298 |
| 4,046,666 | 9/1977 | McClanahan et al. | 204/298 |
| 4,128,466 | 12/1978 | Harding et al. | 204/298.28 X |

(List continued on next page.)

FOREIGN PATENT DOCUMENTS

| | | |
|---|---|---|
| 0269446 | 6/1988 | European Pat. Off. . |
| 0328257 | 8/1989 | European Pat. Off. . |
| 2183557 | 12/1973 | France . |
| 128714 | 12/1977 | Germany . |

(List continued on next page.)

OTHER PUBLICATIONS

Dearnaley, G., "Developments in Ion–Assisted Coatings," *Surface and Coatings Technology*, vol. 33, pp. 453–467, 1987.

Schiller, S., "Ion Plating –A New Promising Vacuum Coating Process," paper presented on *4th Int. Electron Beam Processing Seminar*, Long Island, N.Y., USA, 1976.

(List continued on next page.)

*Primary Examiner*—Nam Nguyen
*Attorney, Agent, or Firm*—Philip A. Dalton

[57] ABSTRACT

A thin film coating system incorporates separate, separately-controlled deposition and reaction zones for depositing materials such as refractory metals and forming oxides and other compounds and alloys of such materials. The associated process involves rotating or translating workpieces past the differentially pumped, atmospherically separated, sequentially or simultaneously operated deposition and reaction zones and is characterized by the ability to form a wide range of materials, by high throughput, and by controlled coating thickness, including both constant and selectively varied thickness profiles.

42 Claims, 18 Drawing Sheets

U.S. PATENT DOCUMENTS

| | | | |
|---|---|---|---|
| 4,142,958 | 3/1979 | Wei et al. | 204/192 P |
| 4,151,059 | 4/1979 | Kuehnle | 204/298.24 X |
| 4,151,064 | 4/1979 | Kuehnle | 204/298.28 |
| 4,166,018 | 8/1979 | Chapin | 204/192 R |
| 4,261,808 | 4/1981 | Walter | 204/298.25 |
| 4,298,444 | 11/1981 | Chahroudi | 204/192 R |
| 4,313,815 | 2/1982 | Graves, Jr. et al. | 204/298 |
| 4,361,114 | 11/1982 | Gurev | 118/723 |
| 4,361,472 | 11/1982 | Morrison, Jr. | 204/192 R |
| 4,392,931 | 7/1983 | Maniv et al. | 204/192 R |
| 4,420,385 | 12/1983 | Hartsough | 204/192 R |
| 4,424,103 | 1/1984 | Cole | 204/192 R |
| 4,434,037 | 2/1984 | Crank | 204/192 R |
| 4,492,620 | 1/1985 | Matsuo et al. | 204/192 R |
| 4,562,093 | 12/1985 | Mario et al. | 204/298.25 X |
| 4,588,490 | 5/1986 | Cuomo et al. | 204/298 |
| 4,588,942 | 5/1986 | Kitahara | 324/71.5 |
| 4,622,919 | 11/1986 | Suzuki et al. | 118/718 |
| 4,637,869 | 1/1987 | Glocker et al. | 204/192.11 |
| 4,655,167 | 4/1987 | Nakamura et al. | 118/718 |
| 4,661,229 | 4/1987 | Hemming et al. | 204/192.13 |
| 4,674,621 | 6/1987 | Takahashi | 198/378 |
| 4,675,096 | 6/1987 | Tateishi et al. | 204/298 |
| 4,692,233 | 9/1987 | Casey | 204/298.24 X |
| 4,693,803 | 9/1987 | Casey et al. | 204/298.24 |
| 4,793,908 | 12/1988 | Scott et al. | 204/192.26 |
| 4,798,663 | 1/1989 | Herklotz et al. | 204/298 |
| 4,824,544 | 4/1989 | Mikalesen et al. | 204/298 |
| 4,834,023 | 5/1989 | Saitoh et al. | 118/730 |
| 4,842,704 | 6/1989 | Collins et al. | 204/192.24 |
| 4,862,032 | 8/1989 | Kaufman et al. | 313/359.1 |
| 5,225,057 | 7/1993 | Lefebvre et al. | 204/192.13 |

FOREIGN PATENT DOCUMENTS

| | | |
|---|---|---|
| 55-145172 | 11/1980 | Japan . |
| 57-207570 | 12/1982 | Japan . |
| 60-7191 | 1/1985 | Japan . |
| 61-149476 | 7/1986 | Japan . |
| 62-287073 | 12/1987 | Japan . |
| 62-284076 | 12/1987 | Japan . |
| 63-76868 | 4/1988 | Japan . |
| 2180262 | 3/1987 | United Kingdom . |

OTHER PUBLICATIONS

Schiller, S., "Processing and Instrumentation in PVD Techniques," presented at the *8th Internat. Conf. on Vacuum Metallurgy*, 1985; *Vakuum–Technik*, 1986.

Schiller, S., et al., "Reactive D.C. High–Rate Sputtering —Deposition Rate, Stoichiometry and Features of $TiO_2$ and TiN Films with Respect to the Target Mode," presented at the *Intern. Met. Coat.*, San Diego, Calif., 1983; *Thin Solid Films*, 1983.

Schiller, S., et al., "Reactive D.C. High–Rate Sputtering with the Magnetron/Plasmatron for Industrial Applications," *Vakcumtechnik*, 30, pp. 1–22, 1981.

Spencer, A.G., "Activation of reactive sputtering by a plasma beam from an unbalanced magnetron," *Vacuum*, vol. 38, Nos. 8–10, pp. 857–859, 1988.

Thornton, J.A., "High Rate Sputtering Techniques," *Thin Solid Films*, vol. 80, pp. 1–11, 1981.

Kienel et al, "Cold Light Mirrors", *Industrial Research/ Development*, pp. 135–139, Jan., 1980.

Ceasar et al, "Multiple drum fabrication for ion beam deposited a-Si:H photoreceptors", *Xerox Disclosure Journal*, vol. 9, No. 3, pp. 173–175, May/Jun. 1984.

Todorov et al, "Oxidation of silicon by a Low–energy ion beam:Experiment and model," *Appl. Phys. Lett.*, vol. 52, No. 1, pp. 48–50, Jan. 4, 1988.

Kaufman et al, "End–hall ion source", *J. Vac. Sci. Technol. A*, vol. 5, No. 4, Jul./Aug., 1987.

Mattox, "Ion Plating Technology", *Deposition Technologies for Films and Coatings*, pp. 249–260.

Carmichael et al, "Coating techniques offer solutions to industrial needs", *Optical Engineering Reports*, p. 3A, Jul. 1987.

*Hollow Cathodes and Hollow Cathode Neutralizers*, Ion Tech., Inc., Jan., 1988.

*ECR Plasma Source*, Applied Science and Tech., Inc., Nov., 1988.

Springer et al, "Characterization of aluminum–aluminum nitride coatings sputter deposited using the pulsed gas process," *J. Vac. Sci. Technol.*, vol. 20, No. 3, pp. 462–465, Mar., 1982.

Anderson et al, "Magnetron reactive sputtering deposition of $Cu_2$/CdS solar cells", *Proceedings, 2nd European Community Photovoltaic Solar Energy Conference*, pp. 890–897, 1979.

"1989 Photonics Technology Trends", *Photonics Spectra*, Jan., 1989.

*Mark I Grindless Ion Source*, Commonwealth Scientific Corporation.

Hmiel, "Partial pressure control of reactively sputtered titanium nitride," *J. Vac. Sci. Technol. A*, vol. 3, No. 3, pp. 592–593, May/Jun. 1985.

Schiller et al, "Reactive D.C. sputtering with the magnetron–plasmatron for tantalum pentoxide and titanium dioxide films", *Thin Solid Films*, vol. 63, pp. 369–375, Apr., 1979.

Schiller et al, "Advances in high rate sputtering with magnetron–plasmatron processing and instrumentation", *Thin Solid Films*, vol. 64, pp. 455–467, Apr., 1979.

*C–Mag Rotatable Magnetron Cathode*, Airco Coating Technology, 1988.

Scherer et al, "Reactive high rate D.C. sputtering of oxides," Apr., 1984.

Schiller et al, "Alternating ion plating –A method of high–rate ion vapor deposition", *J. Vac. Sci. Technol.*, vol. 12, No. 4, pp. 858–864 Jul./Aug., 1975.

GEOMETRIES AND CONFIGURATIONS FOR MAGNETRON SPUTTERING APPARATUS

CROSS REFERENCE TO RELATED APPLICATIONS

This is a continuation of application Ser. No. 08/088,401, filed Jul. 6, 1993, abandoned which is a continuation application of Ser. No. 07/785,230, filed Oct. 24, 1991, abandoned, which is a continuation of application Ser. No. 435,965, filed Nov. 13, 1989, abandoned which is a continuation-in-part of application Ser. No. 374,484, filed Jun. 30, 1989, abandoned which is a continuation of application Ser. No. 154,177, filed Feb. 8, 1988, now U.S. Pat. No. 4,851,095, issued Jul. 25, 1989.

BACKGROUND OF THE INVENTION

The present invention relates to sputtering processes and related apparatus. More particularly, the present invention relates to apparatus and processes for high rate, uniform deposition and formation of thin films of material, such as refractory metals and/or oxides, nitrides, hydrides, carbides, fluorides and other compounds and alloys of such metals, and also to the deposition and formation of composite films. Because the process and apparatus of the present invention are designed to satisfy the stringent requirements of optical coatings, they are applicable as well to a number of other coating applications having less rigorous requirements.

DESCRIPTION OF THE STATE OF THE CONVENTIONAL TECHNOLOGY

DC magnetron reactive sputtering has been developed in recent years as a technique for producing layers of dielectric materials, particularly metal oxides, and oxide semiconductors particularly indium tin oxide. The technique has advantages compared with the RF magnetron techniques for sputtering dielectric materials directly, in that deposition speed gains can be realized, and production equipment is less costly, safer, and easier to control.

It is the conventional wisdom in the coating technology that any process which seeks to take full advantage of the D.C. magnetron sputtering technique and to avoid its potential disadvantages must preferably use partial pressure separation of the substrate and sputtering cathodes. Several approaches have been proposed for implementing partial pressure separation. See, for example, Hartsough U.S. Pat. No. 4,420,385; Schiller et al "Advances in High Rate Sputtering with Magnetron-Plasmatron Processing and Instrumentation", TSF 64 (1979) 455-67; Scherer et al "Reactive High Rate DC Sputtering of Oxides", (1984); and Schiller et al "Reactive DC Sputtering with the Magnetron-Plasmatron for Titanium Pentoxide and Titanium Dioxide Films", TSF 63 (1979) 369–373.

The Scherer technique employs cathodes baffled in such a away as to create an oxidation zone located directly over the sputtering zone. In all other regards, this technique is not directly relevant to our invention as it is designed to deposit material in a single pass and also in that the oxidation of the metal vapor takes place as it is deposited.

The Schiller and Hartsough techniques alternate a substrate between a sputtering cathode and a reactive gas sorption zone, which is the more effective technique for achieving pressure separation. The most complete description of this partial pressure technique is contained in the Hartsough patent, which discloses the formation of non-optical quality wear-resistant aluminum oxide coatings on a disk by rotating the disk past a single sputtering deposition zone and a single oxidizing zone. The entire volume outside the sputtering zone is used as the reaction or oxidation zone, thus the boundaries of the two zones are in contact. Extremely tight baffling between the sputtering cathode and the substrate carrier is required to avoid migration of the reactive gas into the deposition zone. This limits the pressure available for oxidation. Also, the deposition rate available using this approach is inherently limited by the oxidation rate. That is, as the power to the cathode is increased to increase the metal sputtering rate, the table rotational speed must be increased so that the optimum thickness of material is deposited within the deposition zone. However, as the translational speed of the table is increased, the dwell time within the oxidation zone decreases proportionately, with the result that at the limit there is insufficient dwell time within the reaction zone to completely oxidize the metal layer.

The above-described partial pressure technique has at least several additional serious disadvantages.

For example, if one or more additional sputtering cathodes were required for the purpose of providing the capability to deposit other materials in the same apparatus in the same vacuum cycle, the reaction time per translation cycle would be proportionately reduced by the number of additional cathodes. Also, the deposition rate for each material would be proportionately reduced. The technique as described permits only one reaction volume which is always effective and thus precludes the simultaneous deposition of two different metal oxides or other compounds or a pure metal and a compound.

Finally, but not exhaustively, the annular rotating arrangement with its radial speed differential and requirement for a specially shaped magnetron sputtering target places severe restrictions on the achievable film thickness uniformity such that for optical thin film practice the useable portion of the apparatus described would be a narrow annular region.

It is obvious then that the described prior art approach would have difficulty in achieving production of even modest commercial volumes of multi-layer optical filter devices. Also, because of the disadvantages described, if applied to the practical production of multi-layer optical devices, this approach would have no greater throughput than a conventionally-operated RF Magnetron apparatus of the same size and configuration.

IV. SUMMARY OF THE INVENTION

A. Characteristics of Deposition And Reaction Zones

In one embodiment of our invention which differs fundamentally from the prior art, both deposition and reaction are effected in long narrow axial zones that are adjacent and moved relative to the periphery of a substrate carrier. The reaction is effected by means of a highly intense plasma in a highly efficient manner at high gas pressures in a long narrow zone, isolated physically from the metal deposition zone by a region of relatively low pressure. Through the use of a reactive ion source, such as the linear magnetron or suitably configured ion gun, configured to produce an elongated uniform high intensity ion flux adjacent the periphery of the carrier for generating an intense reactive plasma from oxygen or other gas, the high pressure reactive volume is substantially comprised of highly energetic gas species, which greatly shortens the time required for the reaction. A further resulting advantage of this technique is that the technique is not limited to reactive gases such as oxygen, for compounds can be formed using other gases such as nitrogen; hydrogen; hydrogenated carbon-containing gases such as butane, methane, acetylene, etc.; fluorine; hydrogenated fluorine-containing gases such as freon, etc.; and gaseous oxides of carbon, to form nitrides, hydrides, fluorides, carbides, etc., and alloys and mixtures. The invention overcomes the disadvantages of the prior art and affords further advantages in that considerable deposition speed increases can be realized through the use of scaling and multiple stations. The available gas pressures and deposition rates are well above the practically attainable deposition rates using prior art equipment. Curved substrates can also be coated due to the elimination of the requirement for tight baffling.

B. Present System and Method of Operation

According to one aspect of our invention, substrates on carrier means move past a set of processing stations, and/or vice versa, which form thin film coatings on the substrates, including refractory metal coatings and optical quality dielectric coatings such as metal oxide. Basic substrate carrier configurations which are used in our system include the following: rotating cylindrical carriers; rotating disk systems; in-line translation systems; and web-type carrier systems. The base carrier configuration may inherently deposit at different rates on similarly configured (e.g., flat) substrate surfaces or surface regions depending upon the position of the substrate on the carrier. Our invention adapts the configuration of the carrier means itself, the configuration of the deposition device and/or the relative movement of the substrate carrier means and the deposition device to decrease any such tendency to deposit at different rates, and otherwise configures the system to promote uniform deposition rates.

Configurations and adaptations for diminishing deposition rate differences on spaced substrate surfaces are used in various systems, including: cylindrical processing configurations in which substrates are mounted for movement about a single rotational axis, rotating cylindrical carrier; double rotational carriers such as a rotating planetary gear carrier; axially translatable and spiral path rotating cylindrical systems; rotating cylinder and spider systems which include individual flip or rotary substrate carriers; rotating disk systems in which the disk and the processing stations are adapted for radial movement relative to one another; and continuous moving/indexable web or belt systems, including a symmetrical dual web version.

The deposition devices may be selected from one or more of (a) stationary magnetron devices; (b) rotating magnetron devices; (c) point source sputter guns; (d) stationary evaporation sources; (e) centrifugal-force rotating evaporation sources; and (f) reactive ion plating sources. Also, the ion source chemical reaction device may be selected from one or more of (a) self-starting ion guns; (b) non-self-starting ion guns; (c) point ion sources; (d) microwave sources; (e) unbalanced magnetron sources; (f) RF sources; and (g) arc sources.

Alternative magnetron versions comprise (1) at least one magnetron-enhanced sputter deposition device or cathode (a planar magnetron-enhanced device or a rotating cylindrical target magnetron-enhanced device or a rotating magnetron-enhanced multiple target device) operating in a metal deposition mode for depositing silicon, tantalum, etc., and (2) a similar device such as a linear magnetron-enhanced device operating in a reactive plasma mode, or an inverse magnetron ion gun or other ion gun or other ion source configured to produce an elongated uniform high intensity ion flux adjacent the periphery of the carrier, for generating an intense chemically reactive plasma, using oxygen and/or gases such as those listed above. Preferably this arrangement is used to provide the above-described long narrow zones for both deposition and reaction with complete physical separation of the zone boundaries. When devices such as similar linear magnetron-enhanced cathode devices are used, one may be operated using a relatively low partial pressure of the gas (such as oxygen) to provide the metal deposition mode while the other is operated at a relatively higher reactive gas partial pressure to generate the intense reactive plasma for oxidation, etc.

The substrates, deposition devices and ion source reaction devices may be located inside or outside (or both) the drum. Also, the arrangement is scalable in that a multiple number of devices can be used in each processing station set to increase the deposition rates and the number of materials formed. Various processing station arrangements can be provided in a chamber for depositing and oxidizing different or otherwise reacting with metals separately, sequentially or simultaneously. As one example, four stations can be selectively arranged and operated to perform the sequence silicon deposition, oxidation, tantalum deposition and oxidation, to quickly form alternating layers of silica and tantala. For example, one or more silicon deposition stations and one or more associated oxidation stations can be operated simultaneously in time and sequentially in space to form $SiO_2$ layers which are alternated with $Ta_2O_5$ layers formed in the same manner.

In our process, the relationship between the power of the deposition cathodes and the speed of rotation or translation of the substrate can be tailored so that in each pass, a deposited thickness of one or more atomic layers can be obtained. By adding additional cathodes of other materials, and by adjusting the power to each cathode, effectively alloys can be created of any desired ratio. For example, NiCr can be formed in any desired ratio from cathodes of Ni and Cr, over large areas, simply by adjusting the relative power to the cathodes. By adding oxidation stations, one can form complex oxides such as barium copper yttrium oxide, forms of which are known to be superconducting.

BRIEF DESCRIPTION OF THE DRAWINGS

The above and other aspects of the invention are described with respect to the drawings in which.

DESCRIPTION OF THE PREFERRED EMBODIMENTS

A. Rotary Cylindrical Systems

1. Preferred Single and Double Rotation, Rotary Cylindrical Systems

In one preferred aspect, our present invention combines linear DC magnetron-enhanced sputtering cathodes operating in a partial pressure separation regime and rotary cylindrical workpiece transport to provide a sputter deposition system which is capable of high rate formation of single or multi-layer optical films of materials such as, but not limited to, $SiO_2$, $TiO_2$ and $Ta_2O_5$. This combination is achieved despite the previous incompatibility of linear magnetron sputterers and rotary workpiece transport and despite the inherent difficulty (as evidenced in the prior art) in implementing partial pressure separation.

Figure 1:
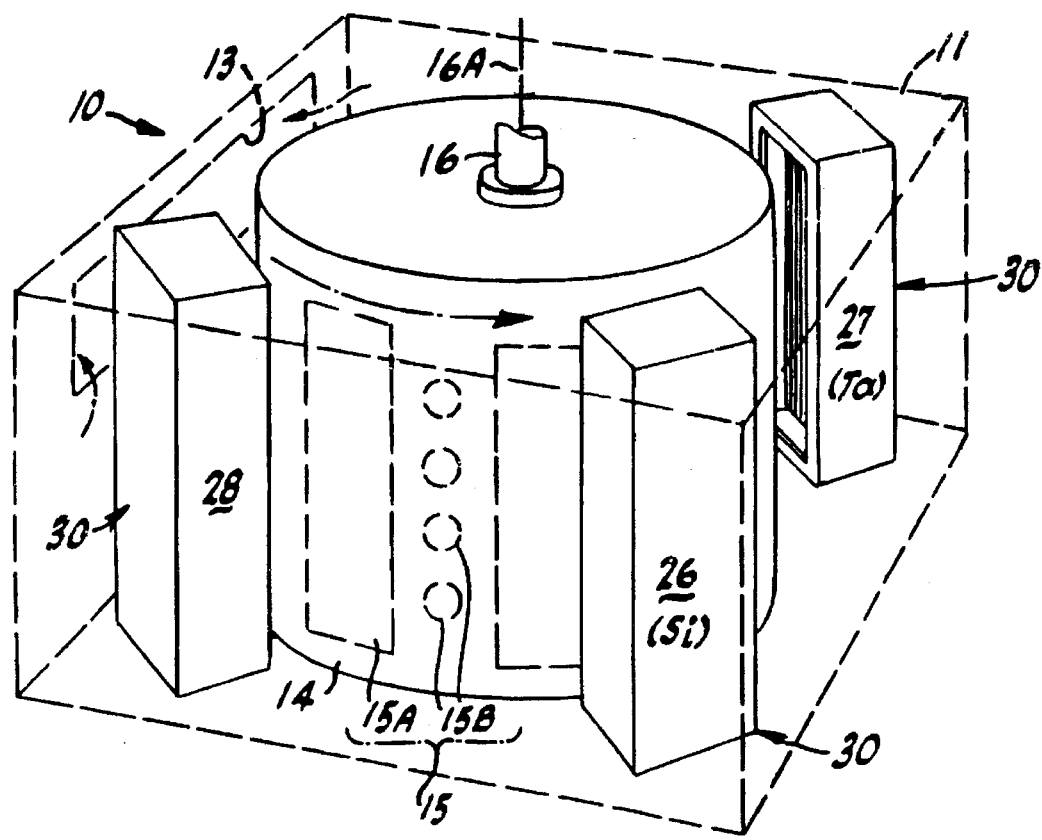
FIGS. 1 and 2 are, respectively, a simplified schematic perspective view and a simplified schematic horizontal sectional view, both of a single-rotational cylindrical drum magnetron-enhanced vacuum sputtering system which embodies the principles of our present invention.
Figure 2:
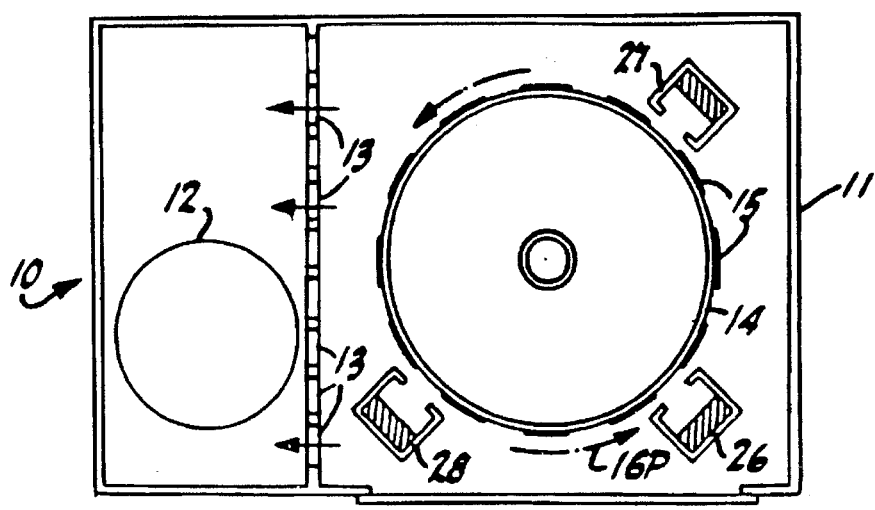

FIGS. 1 and 2, respectively, depict a simplified schematic perspective view and a horizontal sectional view of a single rotation embodiment of our magnetron-enhanced vacuum sputtering system. The illustrated sputtering system 10 comprises a housing 11 which forms a vacuum processing chamber and is connected to a suitable vacuum pumping system 12 shown in FIG. 2. The vacuum pumping system includes a cryopump or other suitable vacuum pump or combinations thereof for exhausting and pumping down the vacuum chamber via exhaust port 13. The system 10 also includes a drum 14 which is mounted for rotation about shaft 16 and has a cylindrical side which is adapted for mounting substrates 15 of various configurations and sizes. The substrates 15 can be mounted directly on the drum 14, facing outwardly toward sputtering stations which are spaced about the external periphery of the drum or facing inwardly toward sputtering stations spaced along the internal periphery of the drum.

Figure 3:
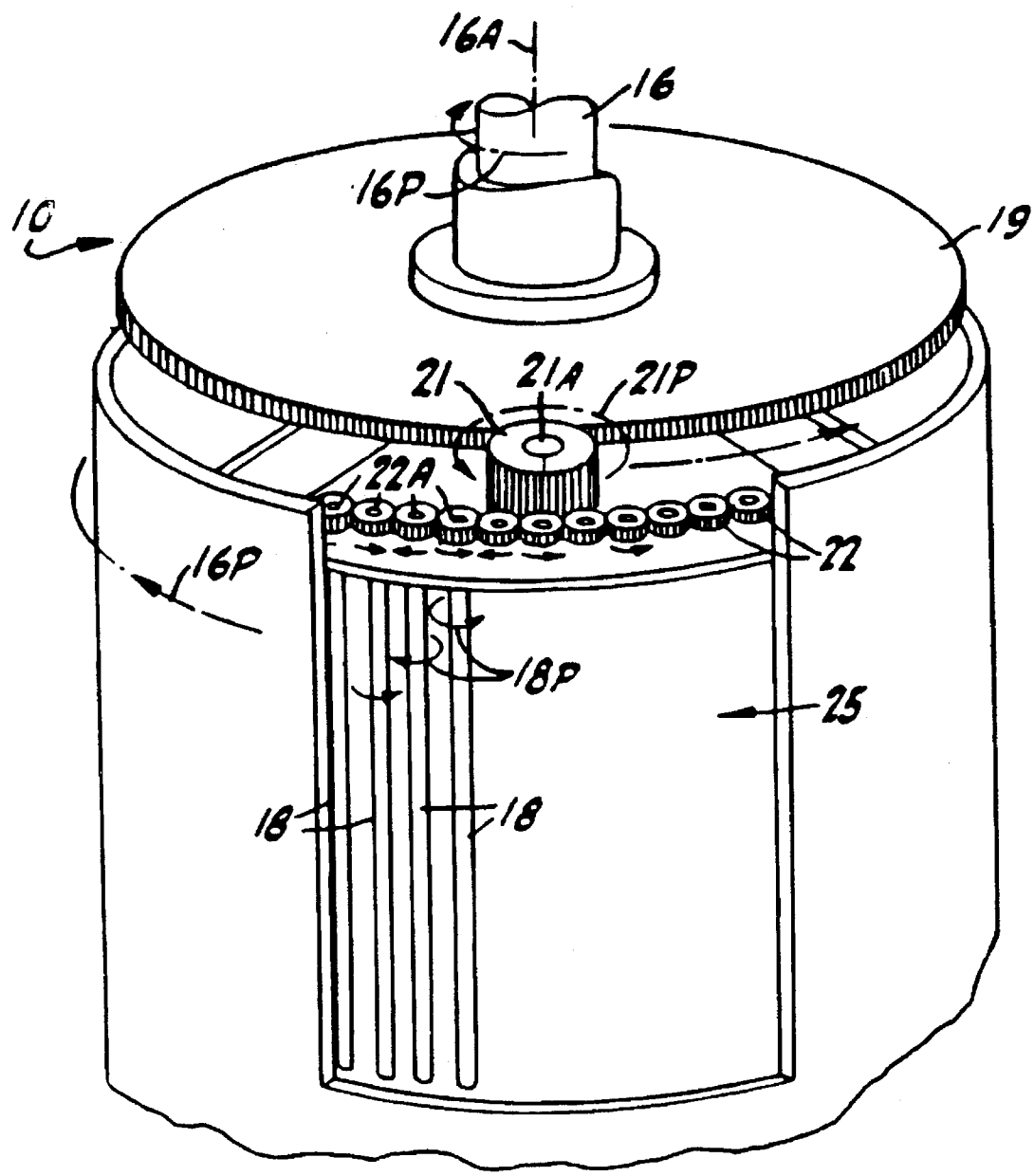
FIG. 3 is a simplified schematic perspective view of a double-rotational, cylindrical drum embodiment of a magnetron-enhanced vacuum sputtering system which embodies the principles of the present invention.

Alternatively, and referring to FIG. 3, the system 10 may incorporate one or more double rotational motion planetary gear mounting arrangements 25, either in conjunction with or as a replacement for the drum 14. The double rotation planetary gear arrangements can be provided on the drum alone or in combination with the single rotation substrate mounting positions 15. The planetary gear arrangement mounts and imparts double rotational motion to articles such as tubes 18. The planetary gear system 25 may comprise a sun gear 19 which is driven by shaft 16. Alone or in conjunction with a ring gear (not shown), the sun gear 19 rotates the associated planet gears 21 about their own rotational axes 21A as well as about the sun gear's rotational axis 16A. In the illustrated embodiment, the planet gear 21 is operatively connected to a train of gears 22 which are mounted on shafts for rotation about their axes 22A. In turn, the tubes 18 are mounted on and rotate with the planet gear support shafts about axes 22A. As a consequence of this planetary gear mounting arrangement, rotation of drum 14 and sun gear 19 along reversible path 16P about axis 16A rotates planet gears 21 along path 21P about axis 21A, which is converted by the gear train into alternating rotation of tubes 18 along paths 18P about axes 22A. This double rotary motion of the sun gear 19 and the planetary gears 21 enhances the ability to coat articles such as tubes uniformly about their entire circumference.

Referring further to FIGS. 1–3, in the illustrated embodiment, a plurality of linear magnetron-enhanced sputtering devices, designated generally by the reference numeral 30, are positioned about the outer periphery of the drum 14. In one exemplary embodiment, the station designated 26 is used to deposit material such as silicon whereas station 27 deposits a different material such as tantalum and station 28 is used to react a gas such as oxygen with the substrates to convert the deposited metal layer(s) to oxide. (Reference numerals 26–28 refer to the processing stations and to the devices at the stations.) Thus, by rotating the drum 14 and selectively operating the sputtering and reaction stations 26, 27 and 28, the metals and/or oxides thereof can be selectively formed on the substrate in essentially any desired combination. For example, by rotating drum 14 and sequentially activating the sputtering cathodes in the sequence 26, 27, while operating the associated reaction station(s) 28, system 10 can form a silicon layer a few atoms thick and oxidize the silicon to $SiO_2$, then deposit a layer of tantalum a few atoms thick and oxidize the tantalum to $Ta_2O_5$. This sequence can be repeated and altered as required to form a composite optical coating of layers of $SiO_2$ and $Ta_2O_5$ of precisely controlled thicknesses. It should be noted that oxidation stations 30 such as the one at station location 28 can use a planar magnetron cathode similar to those used at deposition stations 26 and 27, by substituting oxygen for the argon; or can use other ion sources capable of generating a reactive ionized plasma, such as ion guns or the inverse linear magnetron ion source described below, or other devices such as those described below, which generate the required reactive DC or RF plasma.

2. DC Magnetron Sputter Deposition Devices

Figure 4:
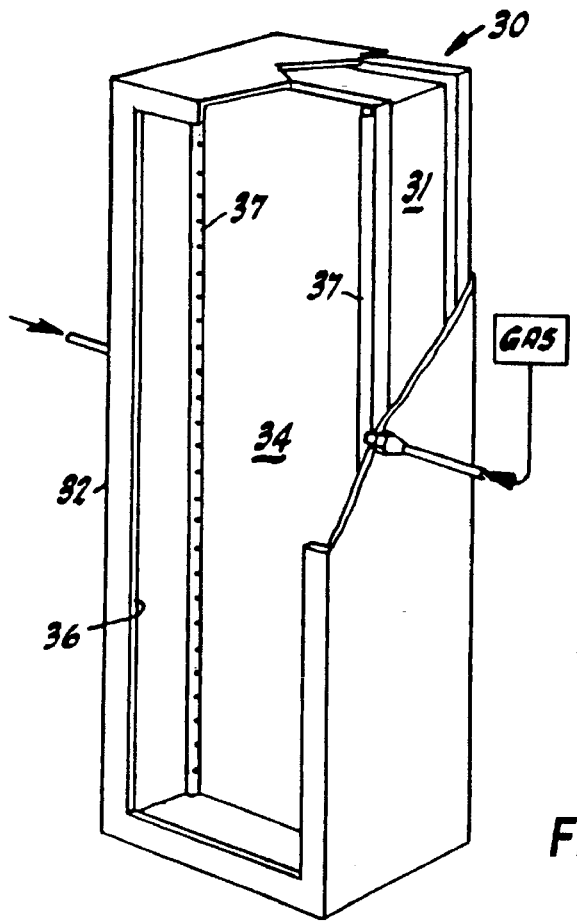
FIGS. 4 and 5 are, respectively, a simplified schematic perspective view, partially cut away, and a simplified schematic horizontal cross-sectional view of one type of DC linear magnetron sputtering device used in the magnetron-enhanced vacuum sputtering system of the present invention.
Figure 5:
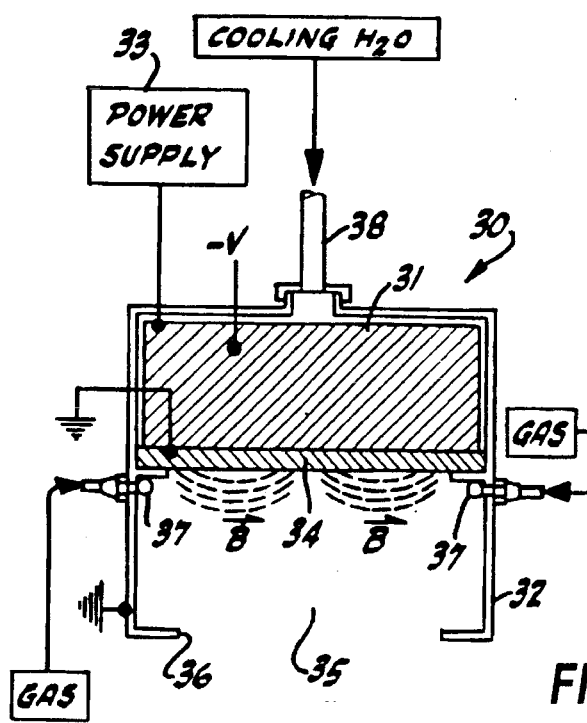

FIGS. 4 and 5 schematically illustrate one type of planar DC magnetron sputtering device 30 which is commercially available from VacTec or other suppliers and can be used at station locations 26 and 27 and, optionally, at station 28, FIGS. 1 and 2. The sputtering device 30 comprises a housing which mounts an electrode 31 and forms a front, gas baffle 32 having an opening 36 which is selectively closed by a shutter (not shown). Electrode 31 is connected to a power supply 33 for applying a voltage of, e.g., −400 v. to −600 v. to the electrode relative to the baffle 32, which is at anode potential (usually ground). Permanent magnets (not shown) are mounted within the electrode body for supplying a magnetic field $\overline{B}$ of rectangular racetrack configuration along the surface of the target 34 and perpendicular to the applied electric field. Manifold tubes 37 are situated adjacent the target 34 and are connected to a source of gas for supplying reactive gas such as oxygen or an inert working gas such as argon to the sputter chamber 35 defined by baffle 32 and target 34. The device is cooled by water which is supplied via inlet 38 and circulated to an outlet (not shown). The baffles 32 in the individual sputter devices 30 effectively divide the overall processing chamber 10, FIGS. 1 and 2, into different regions or sub-chambers at each sputterer in which different gas atmospheres and/or gas partial pressures can be established. Improvements could be readily implemented where one or more additional pumps could be placed to improve separation between regions of reactive and non-reactive gases.

Compounds, etc., such as oxide dielectric films can be formed using the linear magnetron sputter devices 30 at the sputter stations 26 and/or 27 and using a different type of device, such as the ion source 40 which is described in the next section, at reaction station(s) 28. Alternatively, one can use linear magnetron sputter devices 30 at the sputter stations 26 and/or 27 and/or at the reaction station 28. In both cases, the sputter device and the ion source device are enclosed in distinct partial pressure regimes or chamber regions between which the substrate is alternated by the continuously rotating drum. When baffled magnetron cathodes 30 are used both to sputter and to oxidize, the cathodes are operated at relatively high power density in an oxygen ambient within chamber 10 using a target designed for sputtering the selected metal such as silicon or tantalum. However, the baffle-separated magnetron cathodes which are used at stations 26 and 27 for metal deposition are operated in a low reactive gas (oxygen) partial pressure environment for operating in a metal mode and depositing metal at consequentially high rates. The low oxygen partial pressure is supplied by flowing inert working gas such as argon into the chamber area via gas inlet manifolds 37. The other type of baffled magnetron cathode 28 is operated at relatively higher reactive gas partial pressure and sputter deposits the metal at a much lower rate on the moving substrates but oxidizes the metal at a much higher rate. The lower rate target adds little to the overall deposition rate and thus does not affect control, but does produce a highly reactive plasma which allows the chamber oxygen to readily react with the growing thin film and, as a result, permits the use of a relatively low overall chamber oxygen partial pressure, which enhances cathode stability and rate. This reactive sputtering approach provides repeatable thin films deposited at high rates, fully oxidized and with good optical qualities.

3. Inverse Linear Magnetron-Type of Ion Source

Figure 6:
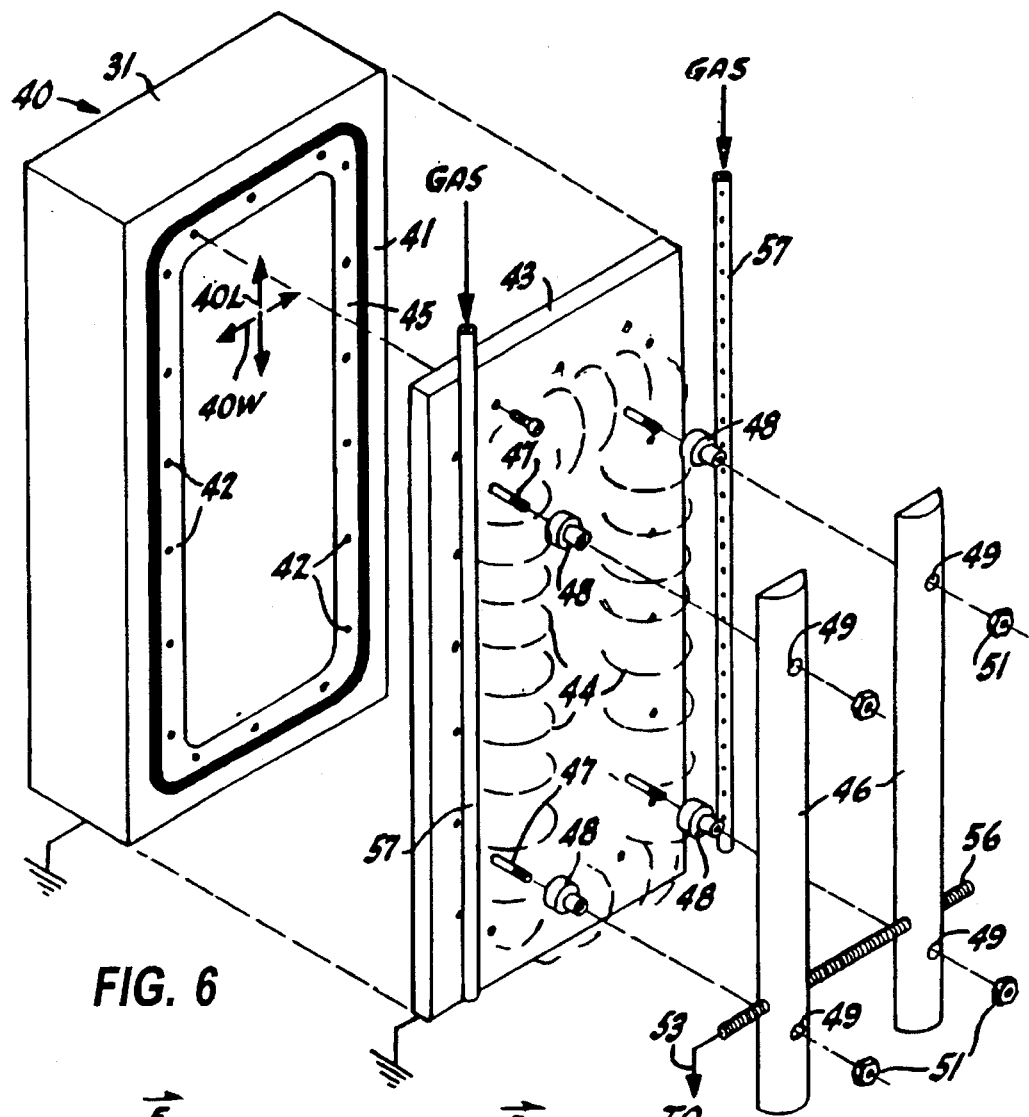
FIGS. 6 and 7 are, respectively, an exploded perspective view and an end view, partly in schematic, of one embodiment of an inverse linear magnetron ion source used in the magnetron-enhanced vacuum sputtering system of the present invention.
Figure 7:
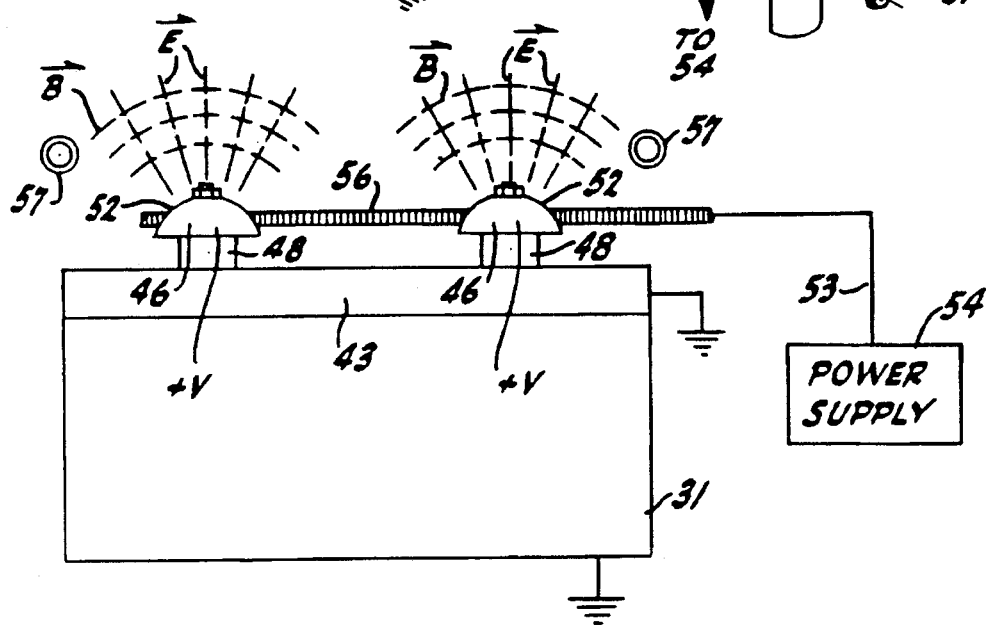

FIGS. 6 and 7 depict a presently preferred embodiment of an inverse (or reverse-biased) linear magnetron-type of ion source 40 which is used at ion source reaction station(s) 28, FIGS. 1–3 to provide the desired narrow elongated reaction zone. The ion source 40 uses electrons associated with the sputtering plasma to generate ions from a reactive gas in a separate local plasma. These ions bombard the sputter-deposited material on the substrates and thus form compounds with the sputtered material. The ion source 40 can use the electrode body or assembly 31 and the housing 32 shown in FIGS. 4 and 5 (for clarity, housing 32 is deleted in FIGS. 6 and 7). As adapted for use as a linear magnetron ion source, direct-cooled electrode assembly 31 includes an O-ring seal 41 and tapped holes 42 in the face to insulatingly mount a non-magnetic stainless steel cover plate 43 in place of target 34 to seal water circulation channel 45 in the body 31. As mentioned previously, body 31 also incorporates permanent magnets (not shown) which provide a magnetic field $\overline{B}$ of elongated rectangular "race track" configuration 44 along plate 43 when the plate is assembled to the body 31. The ion source 40 is mounted adjacent the periphery of the rotatable substrate carrier 14 with its long direction or axis 40L parallel to axis 16A of the carrier 14, FIG. 1, and the width or short axis 40W parallel to the circumference and the direction of rotation 16P, FIG. 3, of the carrier.

A pair of stainless steel bar anodes 46—46 are mounted along the elongated opposite sides of the magnetron race track 44 on posts 47 which themselves are mounted to the non-magnetic plate. The anodes 46 are insulated from the posts 47 and plate 43 by stepped insulator stand-offs 48 having relatively small sections which extend into holes 49 in the bar anodes 46 and larger bottom sections which serve to precisely space the anodes from the stainless steel plate 43, as shown in FIG. 7. For mounting, the posts 47 are inserted through the stand-offs 48 and through the holes 49 in the bar anodes 46, and are secured by nuts 51.

Each anode 46 is a straight bar which is slightly shorter than the long side of the magnetron race track 44. Each anode's curved, generally semi-cylindrical outer-facing surface 52 conforms closely to the shape of the magnetic field lines, $\overline{B}$, FIG. 7. The anodes 46 are connected through wire leads 53 to a conventional power supply 54 capable of providing several amps current at, for example, +50 volts to +140 volts bias. Preferably, insulating beads 56 (or other suitable insulation) are mounted along the section of the leads 53 within the housing to isolate the leads from the plasma and prevent discharge at the wire. Typical operation is at 2 to 4 amps and 100 to 120 volts for a nominally twenty inch long magnetron electrode.

As mentioned, the mounting location or station of the inverse linear magnetron ion source 40 is outside the sputtering region(s) 26 or 27 but within the associated plasma, which extends essentially throughout the vacuum sputtering chamber. In operation, the power supply 54 is used to maintain the stainless steel bar anodes 46 at a positive DC voltage of, for example, 100 to 120 volts relative to the electrode assembly 31 and the stainless steel plate 43, which are at system ground and at an even greater positive potential with respect to electrons in the surrounding plasma. As shown most clearly in FIG. 7, the curved surfaces 52 of the anodes provide electric field lines $\overline{E}$ which are substantially perpendicular to the magnetic field lines $\overline{B}$. Electrons in the associated plasma are accelerated towards the positive anodes 46 and are trapped or confined by the resultant $\vec{E} \times \vec{B}$ field along the magnetron race track, greatly enhancing the probability of collisions with the reactant gas supplied via adjacent inlet manifolds 57, and thereby generating an intense plasma defined by the race track configuration 44. That intense plasma generates many ions from the reactant gas which are accelerated away from the anodes 46 by the potential gradient existing between the anodes and the background plasma and toward the substrates. These energetic, directed ions enhance the reaction process, e.g., by enhancing oxidation of sputtered metals using oxygen as the reactant gas.

In short, during operation, the elongated inverse linear magnetron ion source 40 provides an intense long narrow reaction zone defined by the magnetron race track 44 to have the long dimension thereof spanning substantially the height of the substrate carrier drum 14 and the narrow dimension thereof defined along the circumference of the carrier parallel to the direction of rotation. In distinct contrast to the prior art's requirement that substantially the entire volume outside the single sputtering zone be used for oxidation, in the current version, our ion source 40 has a reaction zone which is only about approximately five to six inches wide and occupies a small fraction of the circumference of the 29 inch diameter drum 14 (5"/π D=5"/91"=5.5%). However, due to the intense magnetic field-enhanced plasma reaction, this reaction zone completely oxidizes the deposited thin film in, typically, a single pass. The small ion source size and the fast reaction rate provide unique upward scaling capability, enabling the use, e.g., of a multiple number of deposition devices such as linear magnetron-enhanced sputter cathodes and of inverse linear magnetron oxidation reaction devices to provide high rate, high volume, high throughput deposition and versatility in the selection of the composition of the deposited coatings.

The combination of the rotatable drum and baffled magnetron-enhanced linear sputtering cathodes and inverse magnetron-enhanced ion source reaction devices has provided high rate, precisely controllable optical quality metal and dielectric layers in thicknesses which are scalable, on both flat, curved and irregularly shaped substrates with a minimum of masking. Also, because a given layer is built up by a multiplicity of coating passes, the effects of cathode arcs are greatly decreased since any such arc represents only a portion of the coating. Additionally, when operating in the metal mode, magnetron arcs are typically less frequent and intense.

The process described above involves sputtering metal materials such as, but not limited to, silicon, tantalum, titanium, iron or any other sputterable material in an atmosphere that permits the target to operate in the metal mode, characterized by the highest rate of sputtering, while elsewhere in the machine establishing an ion process which preferably uses magnetron-enhanced sputtering to expose the freshly deposited film to a reactive atmosphere that converts it to, for example, an oxide. The metal preferably is deposited no more than a few atoms thick in order that the oxidation during the subsequent reaction process is complete. Typically, the sequence of sputter deposition, oxidation, sputter deposition, oxidation is repeated as required to build up the oxide layer to the desired thickness of material such as $SiO_2$. Then if a different layer such as $Ta_2O_5$ is to be formed the same repetitive process is repeated. Quite obviously, various oxide forming cycles and metal deposition cycles can be applied as required to form composites of oxides alone, oxides and metals, or metal(s) alone.

As mentioned above, a locally intense ionized reactive plasma from an ion source such as an ion gun or a planar magnetron is used to provide the oxidizing reaction. The uniformity of the magnetron sputter-deposited metal films is precise, and the cylindrical geometry allows uniform distribution of sputtering materials. Thus, it is possible to use time and power control of the process and almost any width or length of cathode, thereby overcoming the historical problems of controllability, scalability and throughput associated with conventional DC magnetron reactive processes. As demonstrated in the examples below, this ability permits precision deposition of fractional optical layers such as one-sixteenth visible wavelength optical layers which are difficult to deposit using conventional vacuum evaporation processes.

4. Additional Rotary Cylindrical Systems

Figure 8:
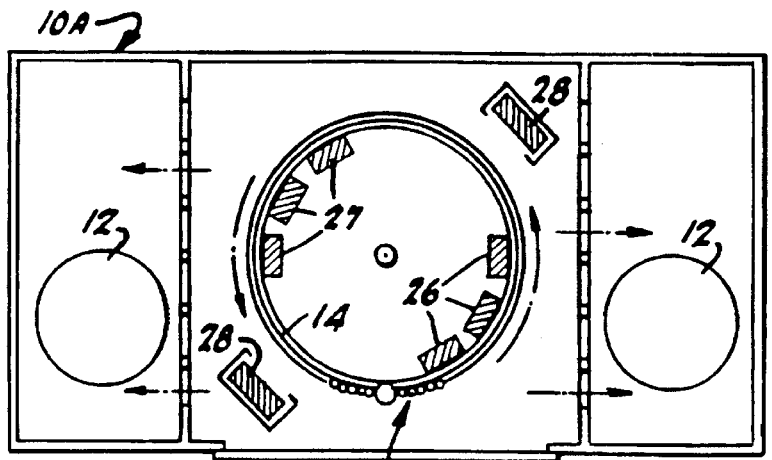
FIGS. 8 and 9 are simplified schematic horizontal sectional views of alternative rotational cylindrical drum embodiments of our system.

FIG. 8 depicts an alternative system 10A which comprises a pair of vacuum pump systems 12—12 situated on opposite sides of the vacuum sputtering chamber, a plurality of devices 26 for depositing material such as silicon and devices 27 for depositing material such as tantalum, on the inside of the drum 14 facing outwardly and interspersed oxidizing or other reaction devices 28 situated on the outside of the rotating drum 14 facing inwardly. The illustrated system incorporates a planetary gear substrate mounting and drive arrangement 25 for uniformly exposing the periphery of work pieces such as tubes to both the internal and external sputtering stations. By virtue of this arrangement, and the multiple silicon, tantalum and oxygen devices, the silicon and tantalum layers and the oxidation of said layers can be done at a high rate on a large number of substrates. For example, a composite layer comprising $SiO_2$ and $Ta_2O_5$ can be formed by operating the oxidizer(s) 28 continuously, while sequentially operating the silicon deposition devices 26 and the tantalum deposition devices 27.

Figure 9:
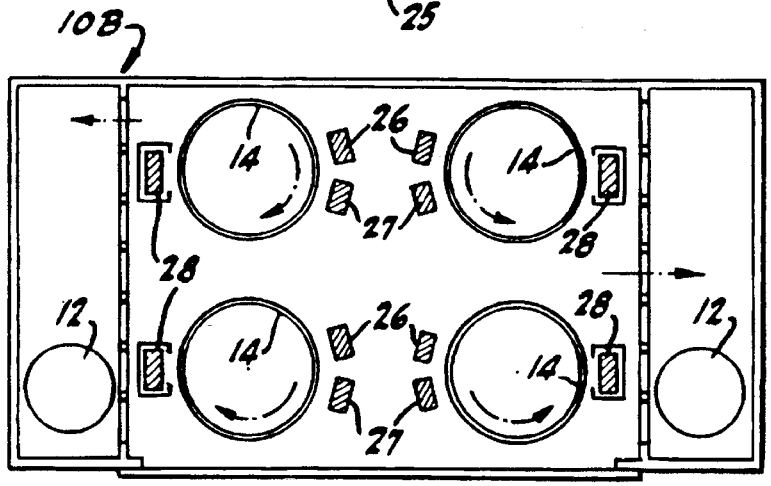

Still another alternative embodiment of our rotary vacuum sputtering system is shown in FIG. 9. Here, the illustrated system 10B comprises a pair of vacuum pump systems 12 and four rotating drums 14, each of which is served by an external array of a deposition device 26 for material such as silicon and a deposition device 27 for material such as tantalum and an oxygen or other reaction device 28.

Figure 10:
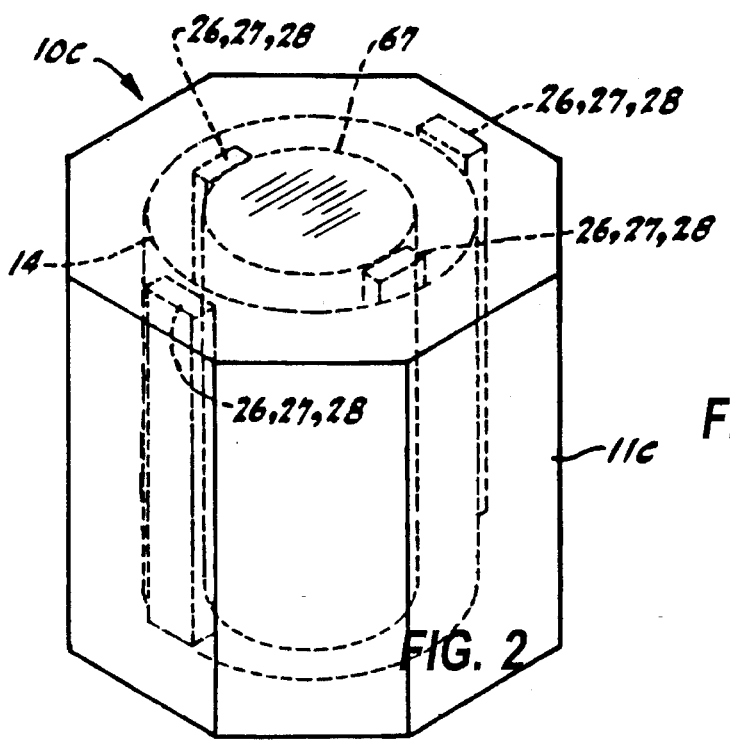
FIG. 10 depicts an alternative to the system of FIG. 2, in which deposition and/or reaction devices are located in a hollow, atmospheric pressure cylinder internal to the rotary drum.

FIG. 10 is a schematic depiction of an alternative approach 10C to the system of FIG. 8 in which deposition and/or reaction devices are located inside and outside the drum 14. An enclosed, stationary, atmospheric-pressure, hollow cylinder or drum 67 is positioned inside the rotatable drum 14. Deposition and reaction devices 26–28 can be mounted on the inner drum 67 for coating from the inside as well as from the outside of the drum 14. Also, tooling such as pump lines and electrical lines can be mounted in inner drum 67, thereby isolating such tooling and associated leaks and contaminants from the vacuum processing environment of drum 14.

Figure 11:
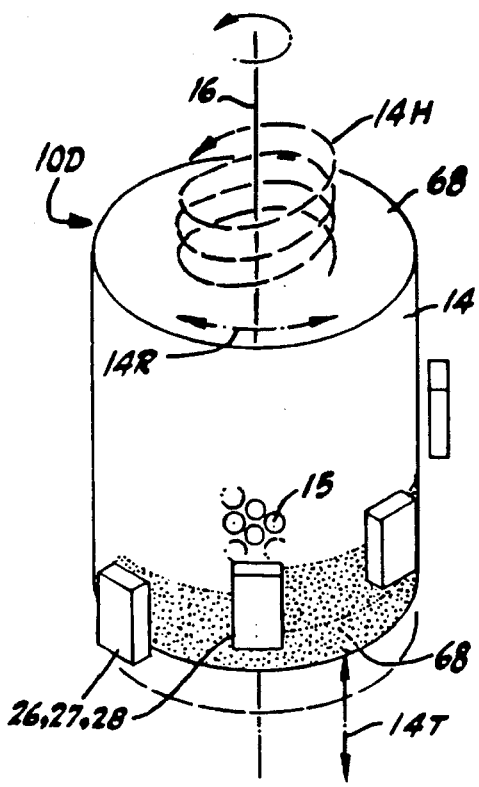
FIG. 11 depicts a helical path alternative to the rotary drum system of FIGS. 1–3.

FIG. 11 depicts still another alternative 10D to the rotating cylinder system of FIGS. 1–3. Here, the drum movement is made helical (see arrows 14H) by the combination of (1) vertical movement of the shaft 16 (or of the drum 14 along the shaft 16) along path 116 and (2) rotational movement of the drum along path 118. In one of a number of drive arrangements, shaft 16 is rotatably mounted at its ends using a journal arrangement and a motor or other drive means is operatively connected to the shaft as by a gear drive mechanism for rotating the shaft and drum along path 14R. The shaft drive motor and journal mounts are supported on a screw drive or equivalent which translates the drum along path 14T.

The helical movement 14H lends itself to the use of multiple targets/sources which span the entire vertical dimension occupied by the drum between its extreme upper and lower positions, as well as along the circumference of the drum.

Also, the helical movement traverses the individual substrates 15 past different ones or all of the multiple number of deposition devices 26, 27 and ion source reaction devices 28, thereby averaging out the deposition and reaction provided by the individual targets and sources and providing more uniform deposition and reaction even when the individual sources are non-uniform.

As alluded to above, the vertical travel 14T of the drum 14 increases the number of substrates which can be processed in one load. That is, when the axial size of the drum (and the number and/or size of the substrates) is increased such that it is larger than the deposition and reaction devices 26–28, the vertical travel enables effective coverage of the enlarged surface and load by the relatively small targets.

Finally, but not exhaustively, the drum 14 can be sealed at the ends by covers 68—68 and the shaft 16 mounted through the covers via a standard vacuum mount such as a rotating ferro fluidic seal.

Figure 12:
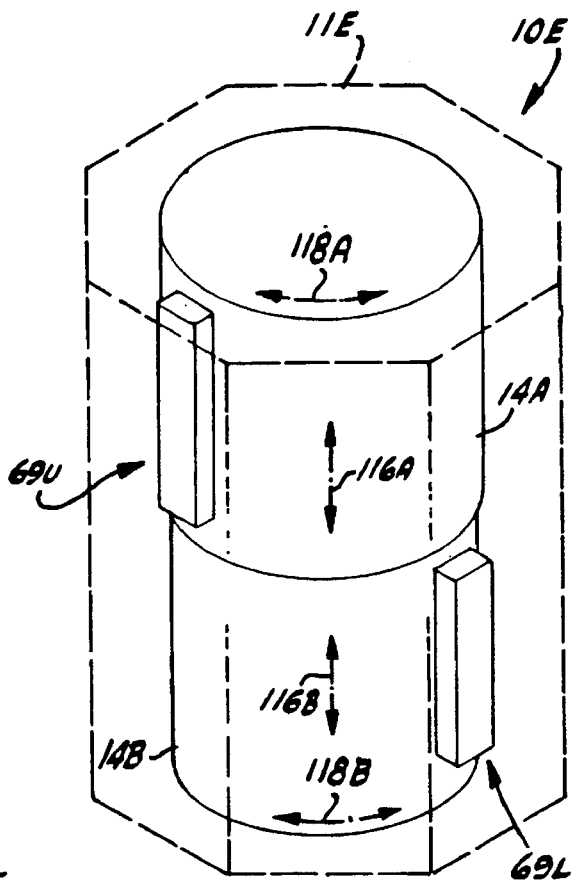
FIG. 12 discloses another alternative to the rotary drum system of FIGS. 1–3, one which uses concentric, vertically translatable rotary drums.

Referring to FIG. 12, in still another alternative rotary embodiment 10E, a pair of concentric rotating cylindrical drums 14A, 14B are mounted for rotary movement along paths 118A, 118B and for vertical travel along typically coincident or parallel paths 116A, 116B between distinct upper and lower zones 69U, 69L. Numerous mounting and drive arrangements will be readily implemented by those of usual skill in the art. For example, upper and lower drums 14A and 14B can be mounted at their respective upper and lower ends to concentric shafts which are mounted and driven in a manner similar to that discussed regarding FIG. 11. The zones may be dedicated, respectively, to deposition and reaction or vice versa. Alternatively, the zones may be dedicated to different layers; for example, zones 69U and 69L may each contain deposition devices or deposition and reaction devices for depositing or for depositing and reacting a specific material such as Si, $SiO_2$, Ta, $Ta_2O_3$, etc. During operation, the two drums 14A, 14B are shuttled vertically, one to the upper zone 69U and the other to the lower zone 69L for single or double rotary movement during processing. The cycle of vertical indexing and processing is repeated as required until the particular coating design is completed.

Figure 13:
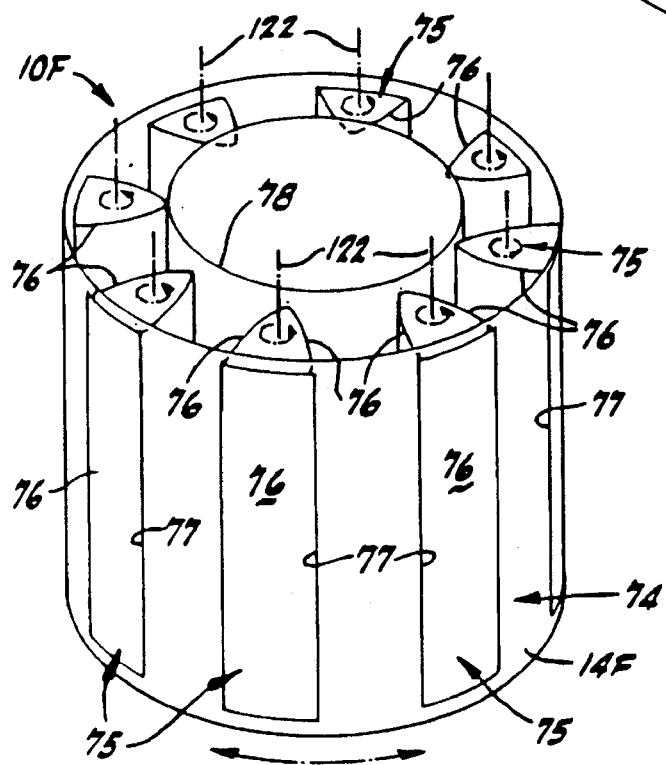
FIG. 13 depicts still another alternative rotary cylinder system, one which includes individual flip or rotary substrate carriers.

In still another embodiment 10F, shown in FIG. 13 (the drum mounting shaft is deleted for clarity), the drum 14F in the cylindrical sputtering system incorporates a tooling system 74 comprising individual substrate carriers 75, each of which is mounted on shaft/axis 122 for flipping or rotating to expose a plurality or multiplicity of substrate-carrying sides or facets 76—76 to the work stations (not shown) during a run, thereby increasing the capacity of the coating machine. The drum 14F has a series of cut-outs 77 in its side which correspond to the size and shape of the individual sides 76 of the substrate carriers 75. Potentially useful substrate carriers include (1) a two-sided arrangement comprising parallel substrate-supporting sides 76—76 which are rotated 180° to present substrates in each bank or side to the deposition and reaction stations, (2) separate drums which are circular, ovular, etc., in horizontal cross-section and (3) multiple-sided support carriers (of triangular or other polygonal cross-section). (For convenient reference, we use "cylinder" to encompass the various cross-sectional shapes of the carriers 75, i.e., to denote double-sided, polygonal, circular and other shapes.) Alternatively, an internal sealed drum 78 which is at atmospheric pressure (or at least is not at the same degree of vacuum as the processing regions) can be incorporated.

In one mounting and drive arrangement, the shafts 122 of the individual carriers 75 can be rotatably journaled to the top and bottom ends of the drum 14F. A motor or motors (not shown), typically operating via a gear drive or other suitable system, rotates the carriers, under system computer control to selectively index or continuously present the different circumferential sides 76 to the radially outward, peripheral work stations. Alternatively, the cylinder carriers 75 can be mounted and rotated by a planetary gear arrangement which presents the faces 76 to the work stations.

Figure 14:
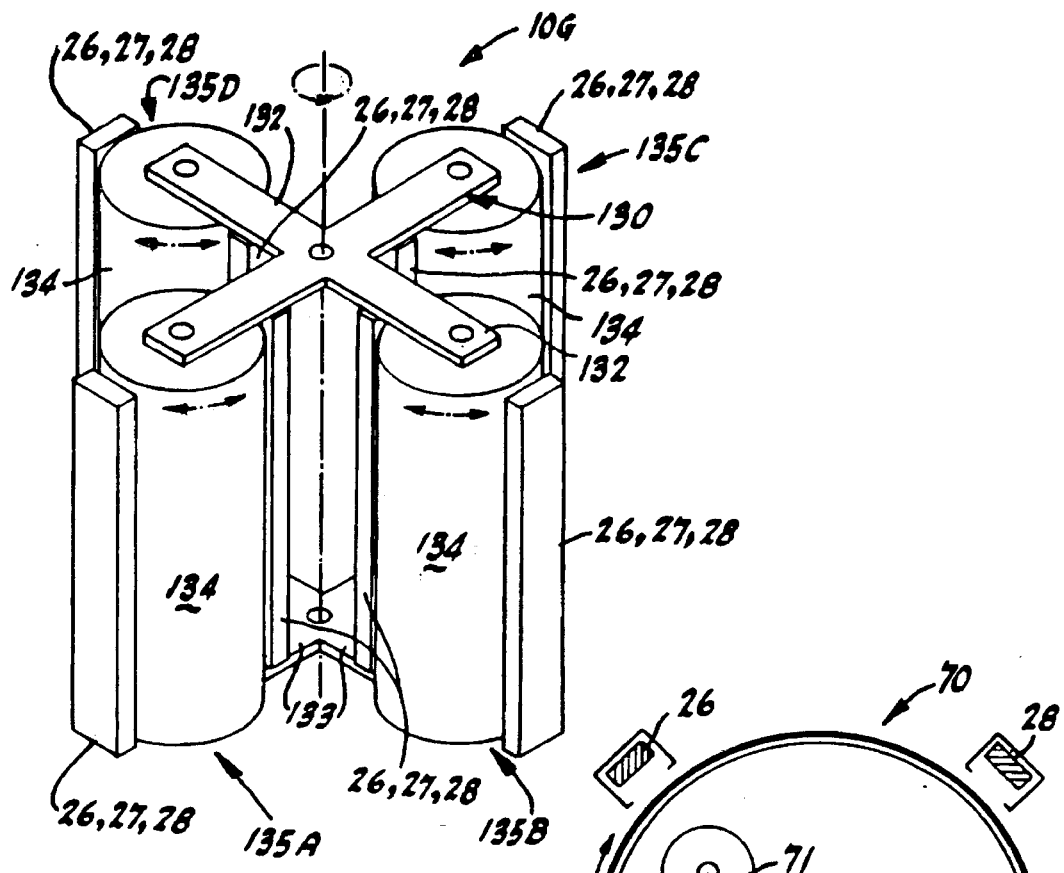
FIG. 14 depicts a spider-type alternative to the rotary drum system of FIGS. 1–3.

FIG. 14 depicts another cylindrical arrangement, in the form of a spider system 10G which permits continuous (i.e., uninterrupted) deposition and reaction treatment. The frame 130 comprises paired upper and lower radial support arms 132–133, each pair of which rotatably supports a cylinder 134 (which may assume any of the configurations discussed relative to embodiment 10F, FIG. 13) and indexes the cylinders between processing stations 135A–135D. As discussed below, one or more materials can be deposited and/or reacted at the individual stations. Alternatively, supports such as tubes can be mounted to the carriers.

In one version of the spider system 10G, the stations 135A–135D are dedicated either to deposition or reaction of one or a (few) monolayers of material. For example, the stations 135A, 135B, 135C, and 135D could contain silicon deposition devices, oxidizers, tantalum deposition devices and oxidizers, respectively.

During operation, the frame assembly 130 is indexed to a selected work station(s) where the individual carriers are rotated for deposition and/or reaction. The cycle of indexing to a selected station and processing is repeated until the desired coating design(s) is completed. In this version, rapid transition between stations maintains throughput.

Alternatively, each station can be dedicated to a particular type of material or materials, not to the deposition or reaction of a monolayer. For example, the individual stations could contain Si or Ta deposition devices and associated oxidizers for building up a desired thickness of $SiO_2$ or $Ta_2O_5$, during single or multiple revolutions/passes of the associated cylinder.

To increase system versatility and provide greater coating speed, deposition/reaction devices can be mounted both radially inside and radially outside the substrate-carrying cylinder 134 at each work station.

SUMMARY OF ROTARY SYSTEM OPERATION

Prior to considering specific examples, it is helpful to review the sequential steps used in our presently preferred method of operating the rotary magnetron sputtering apparatus. Because the examples described below were obtained using the single and double rotational apparatus depicted in FIGS. 1–3, the method of operation is keyed to this apparatus and to revised embodiments of this apparatus which use four (or more) metal sputtering and oxidation/reaction stations, For simplicity, we refer to the exemplary linear magnetron-enhanced type of sputtering devices as cathodes or sputtering cathodes.

Initially, the reflectors or tubes or other substrates are mounted on the periphery of the drum. The vacuum enclosure/chamber is then pumped down to a background pressure of, for example, $1\times10^{-6}$ torr and rotation of the drum at the selected speed is initiated.

Next, the metal sputtering cathodes which are to be used during a selected coating sequence are started up by flowing the sputter gas, illustratively argon, through the inlet manifolds 37 and applying power to the cathodes 31 via associated power supplies 33. Prior to the initiation of the deposition/(deposition plus oxidation) coating cycle, the sputtering cathode shutters are kept closed to prevent deposition.

Once the operation of the sputter cathodes has been initiated, operation of the ion source or ion sources 40 is started. As mentioned, operation of ion source 40 utilizes the plasma associated with the operation of the sputter cathode(s) 30 and, thus, requires prior operation of the sputter cathode. Certain other ion sources, such as the sputter cathode 30 operating in an oxidizer mode, do not depend upon a separate plasma for operation but it typically is preferable not to start even these devices until operation of the sputter cathode has stabilized. Operation of the ion source(s) is initiated by applying the inlet flow of oxygen or other desired reactant gas or mixtures thereof via the inlet manifolds 57 and by applying power via power supply 54.

With the sputter cathodes and ion sources established at stable operating conditions, that is, at stable selected power, gas flow and pressure and with the drum operating at the specified rotational speed to provide selected deposition and oxidation rates, the desired deposition and oxidation sequence is effected by selectively opening the shutters. For example, and assuming that two sputter and two oxidation stations (one oxidation station may suffice) are positioned around the periphery of drum 14 in the sequence metal 1 cathode, ion source oxidizer, metal 2 cathode and ion source oxidizer, the following coatings can be attained by the associated sputter cathode shutter opening sequence (please note, oxidation is continuous and the oxidizer device shutters are maintained open, except when layers are deposited which are not oxidized; during nonoxidation periods, the oxidizers are rendered inoperative, e.g., by keeping the shutters closed, see example 2, metal 1):

1. Metal 1 deposition, oxidation, metal 2 deposition, oxidation → metal 2 oxide on metal 1 oxide;
2. Metal 1 (oxidizer shutters closed), metal 2, oxidation → metal 2 oxide on metal 1;
3. Metal 1, oxidation, metal 2 (oxidizer shutters closed) → metal 2 on metal 1 oxide;
4. Metal 2 (oxidizer shutters closed), metal 1, oxidation → metal 1 oxide on metal 2;
5. Metal 2, oxidation, metal 1 (oxidizer shutters closed) → metal 1 on metal 2 oxide;
6. Metal 1 and metal 2 simultaneously without oxidizers (i.e., the shutters for the metal 1 cathode and the metal 2 cathode are opened simultaneously and the oxidizers are off or the shutters closed) → a layer which is a mixture of metal 1 and metal 2; and
7. Metal 1 and metal 2 simultaneously, oxidation → an oxidized mixture of metal 1 and metal 2.

Quite obviously, an essentially unlimited number of combinations of multi-layer coatings can be formed of various materials and using a multiplicity of cathodes.

Please note, during the formation of mixtures of two or more metals and/or other materials, preferably the sputter cathode shutters are maintained open and the ratio of one material to another or to others is varied by adjusting the power, the pressure, the relative aperture size and/or the relative number of cathodes.

Also, in general, the thickness of a particular layer, either a compound or mixture or discrete material, is determined by the length of time the associated sputter cathode shutter(s) is open.

Based upon the above description and the following examples, those of usual skill in the art will be able to derive essentially an unlimited number of combinations of different compositions, compounds, alloys and mixtures of single and multi-layer metals and other materials and their oxides, nitrides, carbides, etc., including complex materials such as superconductors.

The capability to form films of composite materials and alloys extends to films of continuously varying composition, and thus continuously varying optical properties, in a direction perpendicular to the substrate plane. The composition profiling can be accomplished by continually or periodically varying the power applied to one or more of the sputtering cathodes or by continually varying the aperture or shutter opening at one or more of the sputtering cathodes. Three important device categories are:

Transparent Anti-Reflecting Coatings

These can be produced comprising a single film with a refractive index varying from the refractive index of the substrate material at the substrate to the lowest practical value at the outer interface. Such devices would typically be used to provide anti-reflection coatings effective over very broad bandwidths, generally two or more octaves wide.

Opaque Anti-Reflection Coatings

Typically these coatings, which are used to provide general and selective absorbing surfaces on metal surfaces, can be produced by varying the film composition from 100 percent of some metallic component to 100 percent of some transparent material at the outer interface.

Transparent Films of Continuous Periodically Varying Profile

The refractive index profile could be a simple profile of a fixed frequency, or a more complex frequency-modulated profile. Typical uses of such structures would be as very narrow band reflectors having one or more discrete narrow reflection bands separated by regions of high transmission. A typical application of such devices would be for the protection of the eye or protection of an optical system sensor from laser radiation incident on that system in its wavelength region of transparency.

6. Summation of Certain Practical Advantages of Present System

The cylindrical rotating geometry used in our sputtering system combined with the linear/planar magnetron sputtering stations and reactive plasma stations provide fast, uniform deposition of optical quality coatings on large volumes of both flat and curved parts. Parts such as tubes or polygons can be coated uniformly around the entire periphery thereof by incorporating a double rotating, planetary gear mounting arrangement. Additionally, we have deposited uniform coatings onto complex shapes such as lamp glass envelopes. Also, the application of the sputtering stations and reaction stations to translational systems provides fast, high throughput, uniform deposition of optical quality coatings on large flat substrates such as glass panels. The efficiency of the metal mode deposition in providing high deposition rates for a given power input coupled with the spreading of the deposit and heat over a large number of substrates/large drum surface area provides a unique combination of high deposition rates and low substrate heating which permits the high rate formation of coatings on even plastics and other low melting temperature materials. To provide a basis for comparison, conventional DC reactive oxide sputtering processes provide oxidation rates → 10 Angstroms/second off the target, while our process provides formation rates of about 100–150 Angstroms/second for $Ta_2O_5$ and about 100 Angstroms/second for $SiO_2$.

In one specific aspect, our invention eliminates a major difficulty associated with the prior art vacuum deposition of multilayer and single layer thin films on spherical, curved and non-uniform, unconventional shaped substrates, by reproducibly forming on such substrates durable, high-quality coatings having controlled thickness profiles of selected uniform or variable thickness. Previously, various techniques have been used in attempts to overcome the difficulties in achieving controlled deposition on curved and flat surfaces. For example, others have attempted to solve uniformity problems using either a multiple rotation of the substrate coupled with introducing an inert gas to "scatter" the cloud of depositing material or using a masking technique in which equalization of the deposition rate on the part is accomplished by shadowing high rate regions to match low rate areas. Durability problems associated with the high deposition angle of incidence on curved surfaces can be solved by masking high angle regions. However, these strategies have significant difficulties. For example, scattering is limited to $ZnS/MgF_2$ materials, which produce porous, soft coatings with poor abrasion and temperature durability. Hard coating materials such as metal oxides, when thermalized, suffer from reduced indices of refraction and poor film durability when made using the evaporation process. Masking increases coating chamber tooling complexity, especially for curved surfaces and complex curved surfaces such as bulbs, and reduces deposition rates.

As suggested above, our invention overcomes these problems by using a simple axial rotary motion coupled with our high rate reactive sputtering scheme. Axial rotation produces uniformity along the equatorial axis and the inherently high pressures associated with sputtering provide a gas scattering effect for polar uniformity. The higher energies of the sputtered atoms are sufficient to overcome the thermalizing effects of the gas scattering and the films exhibits good durability. High rates are achieved by using the unique reactive sputtering scheme described above in which the substrates such as (but not limited to) bulbs are rotated alternately through a high rate metallic sputtering zone and an energetic reactive plasma. This combination of rotating cylindrical geometry, and planar magnetron and reactive plasma technologies accomplishes the desired result: providing reproducible, highly durable, optical thin film coatings deposited at high rates and with controlled uniformity on a large surface area and/or a large number of flat or spherical or other curved substrates, including unconventional substrates formed to a complex curvature and/or formed of low melting point materials.

It is emphasized that, as used here in reference to the present invention, phrases such as "controlled thickness profile" or "controlled uniformity" comprise not only the ability to deposit coatings of precisely uniform thickness on flat or curved surfaces, but also the ability to vary in a controlled fashion the thickness of a coating deposited along shaped or non-planar surfaces to achieve desired design objectives such as spectral performance. The controlled deposition on flat and shaped surfaces is disclosed and incorporated in Scobey, Seddon, Seeser et al, U.S. Pat. No. 4,851,095, and in commonly assigned, pending LeFebvre et al, U.S. patent application Ser. No. 381,606, filed Jul. 18, 1989, entitled Process for Depositing Optical Thin Films on Both Planar and Non-Planar Substrates, which application is hereby incorporated by reference.

B. Web Coating System(s)

Figure 15:
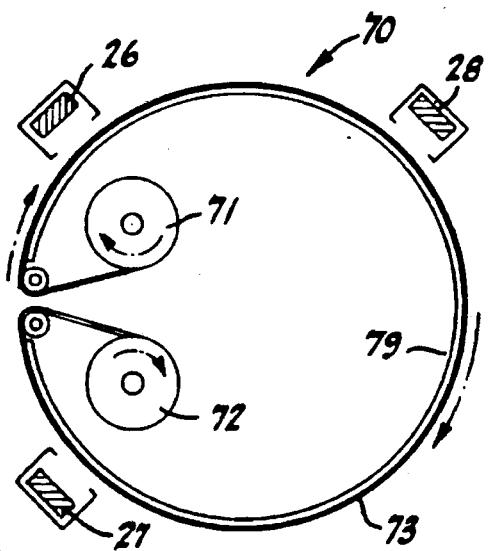
FIG. 15 is a simplified schematic representation of another alternative embodiment of the present rotary vacuum sputtering system, one in which a web is fed incrementally or continuously to the drum and substrates are mounted on the web for processing or, alternatively, the surface of the web is itself processed.

FIG. 15 illustrates still another version 70 of the embodiments of our rotary magnetron sputtering system, one which adapts our linear magnetron sputtering approach to a continuous or incremental sheet or roll. This arrangement 70 provides high rate, tailored single or multiple layer sputtering deposition without the problems of temperature build up and low deposition rates which have hindered prior attempts to deposit materials such as dielectrics on rolls of flexible substrate.

The continuous roll coating arrangement 70 employs a rotating drum 79, an internal unwind roll 71 and an internal take-up roll 72 for cooperatively unwinding the flexible sheet or web 73 of material from the unwind roller, advancing the flexible web 73 intermittently or continuously about the circumference of the drum 79 past linear magnetron sputtering stations, and taking up the flexible web or film on the internal roll 72.

This continuous roll coating arrangement 70 can be used to form coatings on the flexible web 73 itself or on substrates 15 which are mounted on the web. In addition, at least several modes of operation are possible. For example, one can sputter deposit or oxidize one layer at a time along the entire length of the web 73 by continuously/intermittently advancing the web and operating the selected device or group of devices to deposit the selected material or oxidize the previously deposited material. To form a multiple layer composite film, the web is then rewound and the process is repeated as required to obtain the desired thickness of the individual layer or multiple layers.

Secondly, one can coat entire sections of the web at a time up to a length which does not exceed the circumference of the drum 79. To do this, the web is indexed to present the desired section of the web 73 to the appropriate device or group of devices, then the deposition or oxidation operation is performed on that selected section. The web is then indexed to present another section to these or a different group of stations. Quite obviously, this approach affords an essentially unlimited number of combinations for depositing or forming different layers, including dielectric layers, on different sections or substrates.

The continuous roll/web coating arrangement 70 extends the previously discussed ability of our magnetron sputtering arrangement to coat single and multi-layer composites of sputterable materials (including metals and oxides) to large area continuous roll coating technology.

Figure 16:
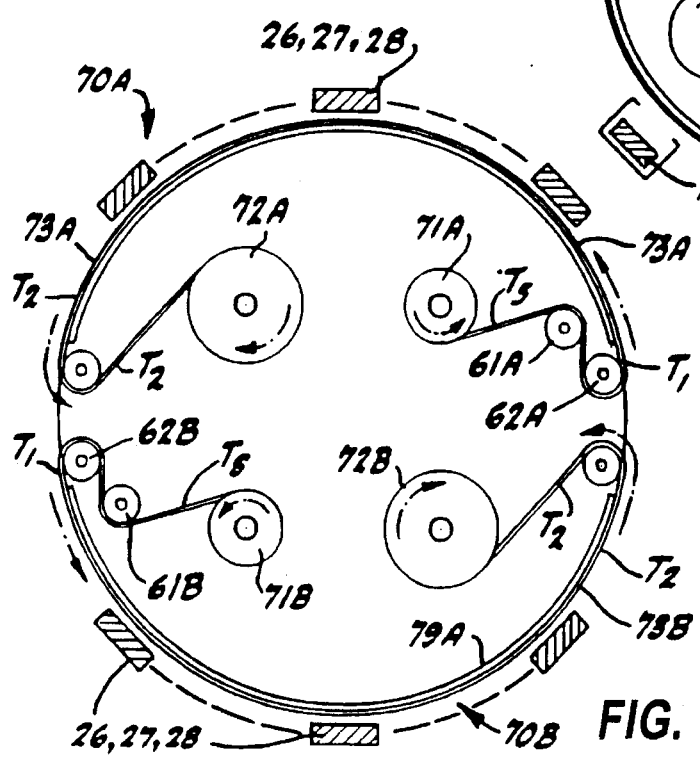
FIGS. 16–18 disclose three alternative web or roll coating systems.

Referring to FIG. 16, an alternative roll coating system comprises two "half" systems 70A, 70B, each of which incorporates film supply reel 71, associated idler and feed roller 61 and 62, and a take up reel 72, in a symmetrical layout. The advantages are that balance is maintained if feed rates are kept identical in each half system 70A, 70B and that wrap around the main drum 79 is reduced to minimize frictional drag.

As illustrated in FIG. 16, this is a unidirectional feed system. However, by adding idlers and feed rollers on the take up side, the film can be driven in either direction.

In the illustrated arrangement, local film tension is designated as $T_1$, $T_2$, or $T_S$. The relationship between these tensions can be determined from the well-known formula $T_2/T_1 = e^{\mu\theta}$, where $\mu$ is the coefficient of friction between the film and the drum and $\theta$ is the wrap angle.

For $\mu=0.5$

If $\theta=342°$, $T_2/T_1=20$;

If $\theta=171°$, $T_2/T_1=4.5$.

For $\mu=1.0$

If $\theta=342°$, $T_2/T_1=390$;

If $\theta=171°$, $T_2/T_1=20$.

Clearly, reduced wrap significantly reduces the difficulty of smoothly sliding the film over the drum.

Please note, in the various roll coaters, the outer surface of the drum can be coated with temperature stable, durable, low friction material such as Teflon™ or filled-Teflon™ material to enhance low friction movement. Shelves or flanges, also of Teflon™ material or equivalent, can be mounted at the bottom or at the opposite ends of the drum to position the web on the drum.

Figure 17:
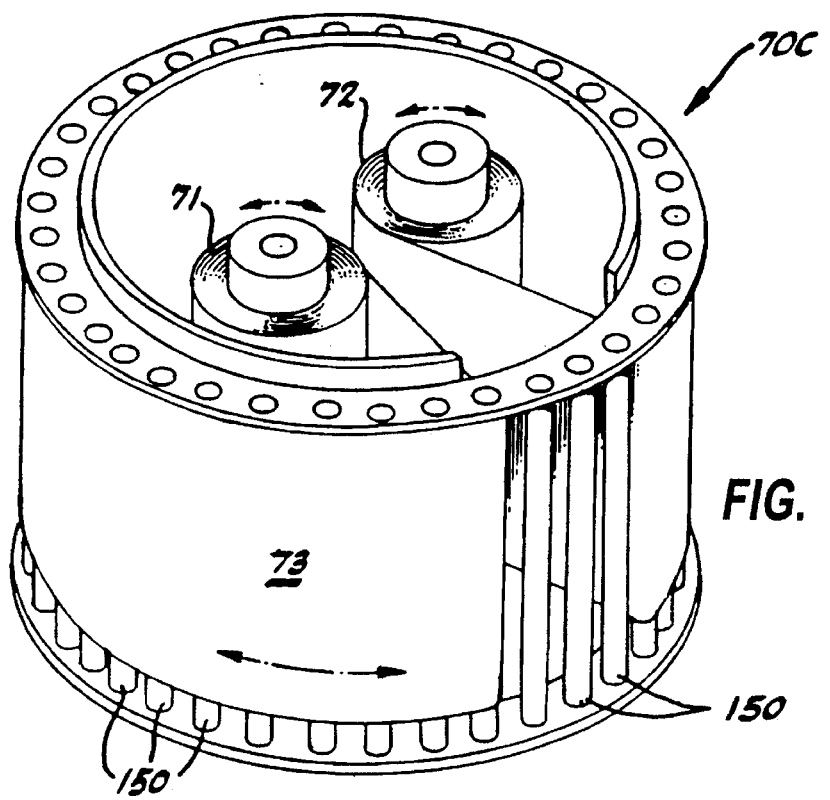

FIG. 17 depicts a second alternative web arrangement 70C in which axial rollers 150 are mounted along the periphery of the drum to permit the low friction, relative movement of the drum and web.

Figure 18:
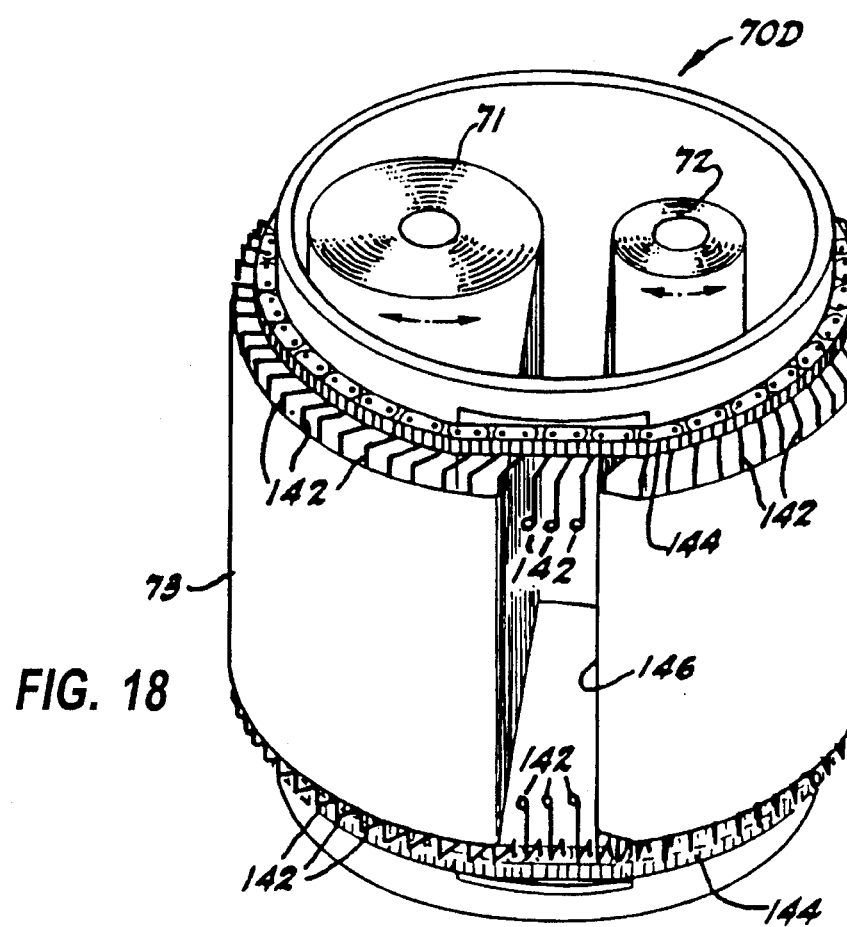

In a third alternative web embodiment 70D shown in FIG. 18, mechanical fingers 142 are mounted on chains 144 about the peripheral edges of the drum. The fingers hold the web 73 and permit relative motion between the web and the drum. The fingers 142 are released from the web at one side of the drum opening 146 and are reengaged at the opposite side thereof, for example, by a cam-type principal of the sort conventionally used in the sheet printing industry.

C. Disk Systems

As discussed below, the inherent tendency of rotating disk substrate carriers to effect different deposition rates in the radial direction is compensated by rotating the substrates on the disk itself (FIGS. 19–21), by moving the deposition device radially along the disk at a velocity proportional to the radial position (FIG. 20), by the use of a target/device width which increases with increasing radial distance, and/ or by masking the deposition device.

Figure 19:
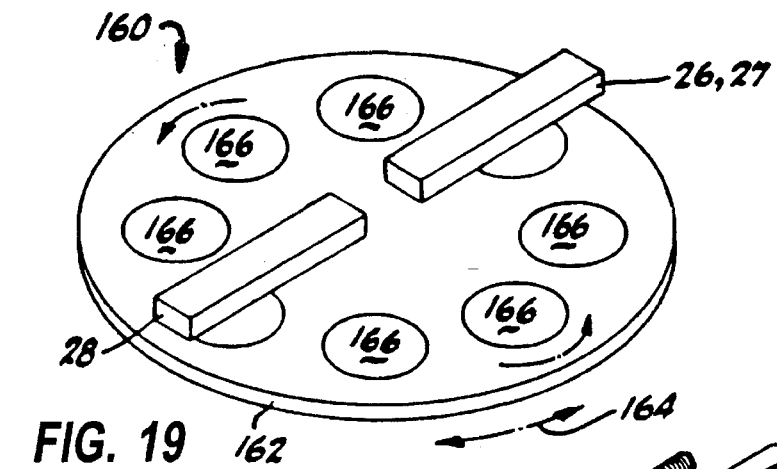
FIGS. 19–21 depict disk systems which incorporate a dual rotary disk arrangement (FIG. 19), dual rotating disks and radially translatable targets (FIG. 20) and a slanted, centrifugal force-substrate hold disk (FIG. 21)

FIG. 19 depicts a system 160 in which a main substrate carrier disk 162 is mounted for rotation in the direction 164. Sputter cathode and reaction stations such as 26, 27 and 28 are positioned facing the disks, opposite one or both major surfaces thereof. To increase deposition uniformly, the substrates can be mounted on smaller disks 166. The smaller disks 166 can be mounted for independent rotation or can be part of a planetary gear train which rotates the disks at a rate which is a function of the rotational speed of the main disk 162.

Alternatively, the substrates can be mounted at fixed positions on disk 162. To enhance uniformity, the sputter cathodes/deposition devices can be formed in a pie-shaped configuration or other configuration in which the target/ device width increases with increasing radial distance. Also, the cathode/device can be masked.

The disk system 160 can be operated in a continuous mode or in an indexed mode. For continuous operation, the disk 162 is continuously rotated past the deposition device(s) 26, 27 and reaction device(s) 28 and, preferably, the smaller disks 166 are rotated to enhance axial processing uniformity. Rotation varies the radial position of the disks and the substrates thereon relative to the radially-extending deposition and reaction devices 26, 27, 28. For indexed operation, the drum 162 is selectively moved between work stations and, during processing at the selected station(s), the smaller disks 166 are rotated.

Figure 20:
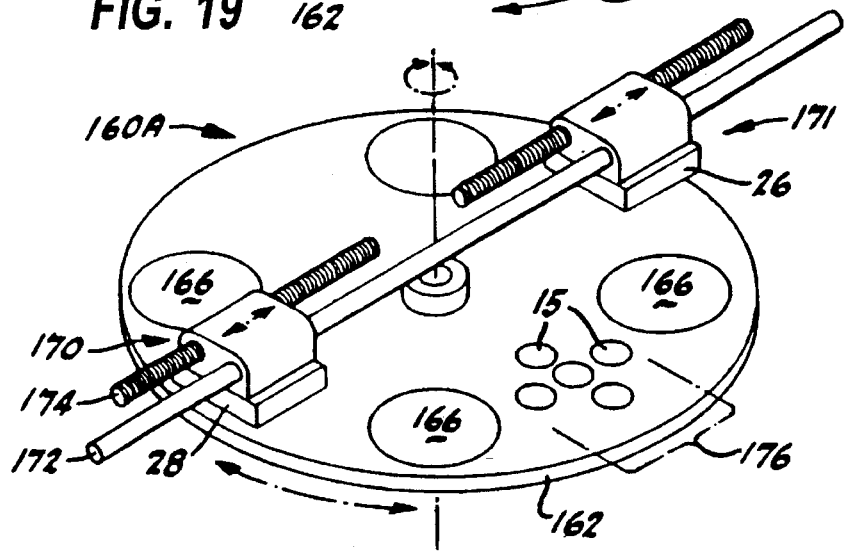

In an alternative disk system 160A depicted in FIG. 20, the deposition devices such as 26, 27 and/or the reaction devices 28 are mounted on a slide arrangement 170 for controlled radial movement relative to the main disk 162, to enhance process uniformity. In a typical arrangement, the devices are slidably mounted on a guide shaft 172 and are translated radially by a motor-driven lead screw 174 or by a magnetic coupling drive arrangement under control of the system computer. This controlled movement tailors the residence time of the devices to their radial position. That is, the residence time of the devices 26, 27 and 28 is directly proportional to their radial distance from the center of the disk rotation. As indicated at 176, the substrates 15 can be mounted at fixed positions on the disk 162 or on the smaller disks 166.

Figure 21:
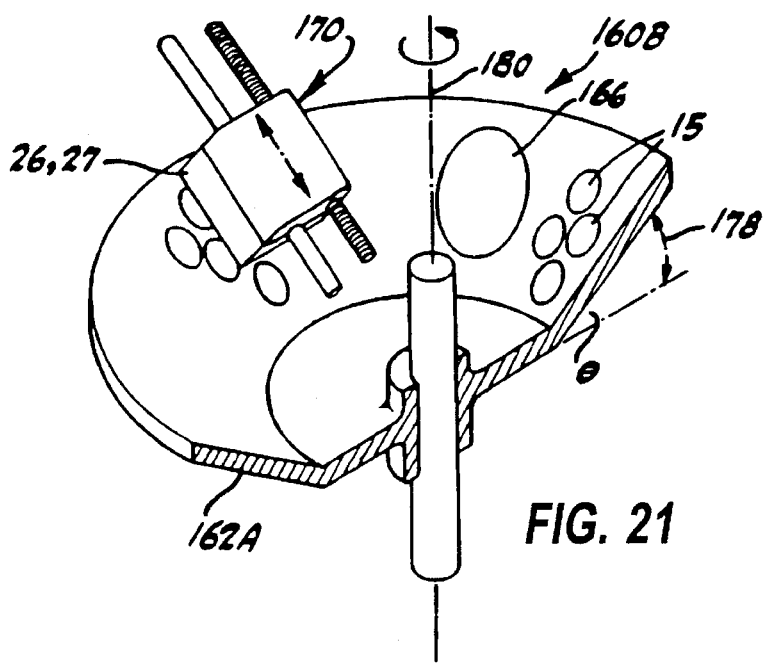

FIG. 21 depicts another alternative embodiment 160B in which a centrifugal-force-hold, shaped disk 162A which is similar in configuration to the cone-shaped platens used to hold semiconductor wafers during fabrication operations such as ion implantation. The plane of the disk 162A is oriented at a small angle θ, typically of a few degrees, relative to the normal 178 to the rotational axis 180. Consequently, upon rotation of disk 162A a component of centrifugal force holds the substrates 15 against the disk. This simple, centrifugal hold approach permits high rotation rates. This is advantageous because the amount of material deposited during each pass is fixed/limited. Throughput is thus limited by the rotational speed, and is increased by increasing the rotational speed.

The disk 162A, FIG. 21, may be used in combination with the fixed or translatable deposition and reaction devices 26, 27, 28 depicted in FIGS. 19 and 20, respectively. Either or both fixed substrates 15 or substrate-holding smaller disks 166 may be mounted in/on the shaped disk 162A. Also, the shaped disk carrier 162A itself may be substituted for disk(s) 166 in the systems 160 and 160A shown in FIGS. 19 and 20.

In still another embodiment (not shown), the substrate may be stationary and the ion source reaction device may be an annular ion gun which is mounted concentrically about an S-gun sputtering target. The concentric devices are mounted on an xy stage or an Rθ stage which moves the deposition device and reaction device (such as an oxidizer) together to cover the substrate surface.

D. In-Line Translational Systems

Figure 22:
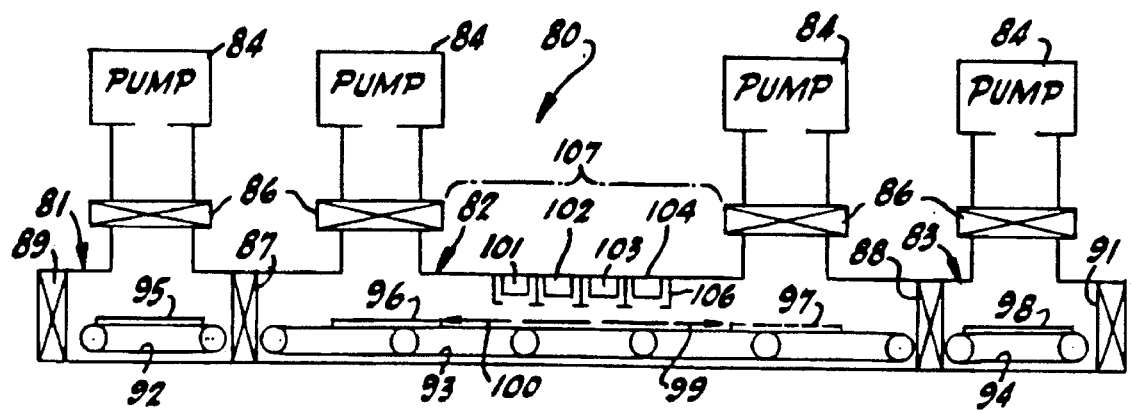
FIGS. 22–25 depict alternative embodiments of in-line magnetron-enhanced vacuum sputtering systems which employ separate deposition and reaction zones in accordance with the present invention.

FIG. 22 is a schematic depiction of another alternative embodiment of our magnetron sputtering system, specifically, an in-line translational system 80 which is uniquely suited to the coating of flat substrates. Generally, the in-line translational embodiment has many of the advantages of the previously-described rotary system relative to the prior art. System 80 also has the advantage relative to the previously described rotary embodiments of being able to coat very large, flat substrates. In rotary systems, such large substrates would require a drum diameter which is too large to be commercially practical. In addition, the in-line translational system 80 has the advantage, relative to prior art flat glass coating systems, of being able to provide equivalently high coating throughput using a chamber which is a fraction of the size of the prior art systems.

The embodiment 80 of our in-line translational system shown in FIG. 22 is typical of in-line coating systems, in that modular subchambers are used. Thus, system 80 comprises three basic chambers: a vacuum load lock chamber 81; a vacuum processing chamber 82; and a vacuum unload lock chamber 83. Illustratively, each chamber is equipped with separate pumping systems 84 and separate high vacuum valves 86. The process chamber 82 can be isolated from the loading and unloading chambers by vacuum locks 87 and 88. Substrates are loaded through a vacuum lock or door 89 of the load chamber 87 and are unloaded through a similar vacuum lock 91 of unload chamber 83. The chambers, which are shown in cross-section in FIG. 22, typically are thin, flat boxes which can be mounted either horizontally or vertically.

Means such as endless conveyor belts 92, 93, 94 are provided in the chambers for transporting substrates. Please note, substrates such as glass window plates are sufficiently large to bridge the gaps between the conveyors and the different chambers. Load lock conveyor 92 is used to move a substrate at position 95 from the load lock 81 through lock 87 into the processing chamber 82 to position 96. (In referring to the substrates, reference numerals 95–98 denote substrate positions as well as the substrates themselves.) Processing chamber conveyor 93 transports substrates rapidly and typically at a constant velocity from entry position 96 in the direction 99 past processing stations 101–104 to position 97 and returns the substrates in the direction 100 past the processing stations to the position 96. Unload conveyor 88 receives substrates at vacuum lock 88 and transports them into the unload chamber 83.

Optionally, conveyors can be located outside the load lock chamber 81 and the unload lock chamber 83 to feed substrates to the load lock chamber 81 and unload substrates from the unload lock chamber 83.

As mentioned above, the illustrated processing chamber 82 contains four processing stations including, in order, end reaction station 101, intermediate or internal deposition stations 102 and 103 and end reaction station 104. The various previously-described sputter devices and ion source reaction devices can be used. Preferably, the processing stations are provided with baffles 106 to isolate the reaction and sputtering zones. The deposition stations 102, 103 may be used to sputter a variety of materials and metals such as metal M1 and metal M2. Preferably, the deposition stations 102 and 103 and the reaction stations 101 and 104 use the above-described linear configured magnetron sputter devices 30 and the inverse magnetron ion sources 40, respectively. The devices 30 and 40 are adapted in size to form long, narrow, linear deposition and reaction zones in which the narrow dimension or width of the zones extends along the directions of movement 99 and 100 and the length of the zones encompass the substrates dimensions transverse to the length of the conveyors and the direction of movement.

Figure 23:
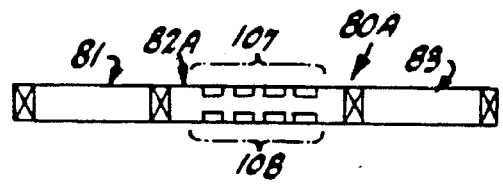
Figure 24:
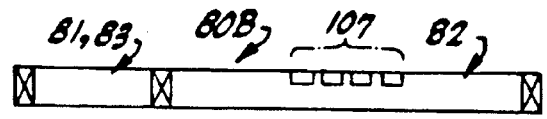
Figure 25:
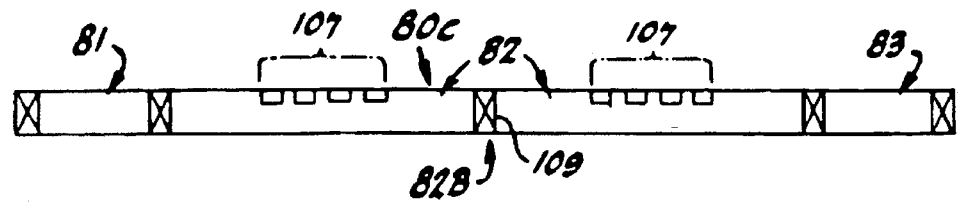

Further embodiments of the system 80 will be readily derived by those of usual skill in the art, including, but not limited to, the three versions illustrated in simplified schematic form in FIGS. 23–25. The first variation 80A shown in FIG. 23 includes a load chamber 81, an unload chamber 83 and a process chamber 82A which comprises separate upper and lower banks 107 and 108 of deposition and reaction zones positioned on opposite sides of the conveyor (not shown), instead of the single, upper bank 107 used in system 80, FIG. 22. The arrangement shown in FIG. 23 allows a substrate 96 to be coated simultaneously on both sides or allows two substrates mounted back-to-back to be coated simultaneously, each on one side.

FIG. 24 illustrates another alternative embodiment 80B comprising a processing chamber 82 and a load lock chamber 81 which also functions as the unload chamber. This embodiment can be utilized where either cost or space precludes the use of separate load lock and unload lock chambers.

FIG. 25 depicts a third alternative embodiment 80C which includes a load lock chamber 81, an unload lock chamber 83 and a process chamber arrangement 82B comprising two separate process chambers 82–82 separated by vacuum lock 109. This embodiment can be used either to enhance total system throughput or where a very high degree of isolation is required between the reactions in the two banks of processing stations 107—107.

Referring again to system 80, FIG. 22, to illustrate the operation of an in-line translational system, initially the locks or doors 87, 88 and 91 are closed and the processing chamber 82 and unload chamber 83 are pumped to a background pressure of about $10^{-6}$ torr. A substrate such as 95 is then loaded through the door 89 into the load chamber 81 and the lock 89 is then closed and the load chamber is pumped to a background pressure typically of $10^{-6}$ torr. The lock 87 is then opened, the substrate is transported into the processing chamber 82 to position 96, the lock 87 is closed and argon is inlet to the sputtering magnetrons 102 and 103 at a pressure which typically is about two microns. Power is then applied to the deposition devices, such as to the cathodes of the sputtering magnetrons 102 and 103 to begin sputtering metals such as M1 at cathode 102 and metal M2 at cathode 103. The shutters at the magnetrons 102 and 103 are closed during this period until the sputtering conditions stabilize. The reactant gas such as oxygen is then admitted to the ion sources 101 and 104 and the sources are ignited by applying the appropriate bias voltage.

To initiate coating, the shutter covering the aperture of magnetron 102 is opened and the substrate at 96 is transported at a constant velocity in the direction 99 past the processing stations to position 97, then is returned in the opposite direction 100 to position 96. The transport velocity and the sputtering parameters can be adjusted so that typically not more than three atomic layers of material is deposited in one pass and approximately twenty Angstroms of oxide is deposited in one forward and reverse cycle. The forward and reverse transport cycle is repeated until the desired oxide thickness of metal M1 has been built up on the substrate. At that point, the shutter for the magnetron 102 is closed.

The shutter covering the magnetron 103 is then opened and the deposition process described in the preceding paragraph is repeated to deposit a layer of metal M2 oxide to the desired thickness. The two metal oxide deposition steps can be repeated until a desired multi-layered combination is deposited on the substrate. Also, layers of the metals M1 and/or M2 can be incorporated (that is, metals can be formed without oxidation) by keeping the shutters on the ion source devices closed during the associated pass of the substrate through the bank 107 of processing stations or by otherwise keeping the ion sources inoperative during the pass.

After the desired coating is formed, the pressure in the unload station 83 is matched to the pressure in the process chamber 82. The lock 88 is opened and the coated substrate 97 is transported into the unload lock chamber 83 to position 98. The lock 88 is closed and the unload lock chamber 83 is raised to atmospheric pressure. Then the lock 91 is opened so that the substrate at position 98 can be removed from the unload lock chamber.

Quite obviously, the in-line translational system 80 can also be operated in a continuous mode in which the loading of new substrates into load chamber 81 and the unloading of previously processed substrates from the unload chamber 83 are synchronized with the coating process.

Figure 26:
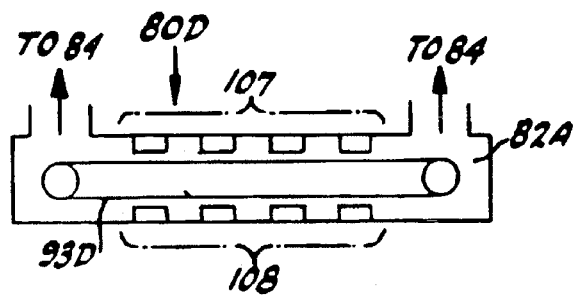
FIGS. 26 and 27 depict schematically still other alternative in-line systems which use an endless belt or conveyor.
Figure 27:
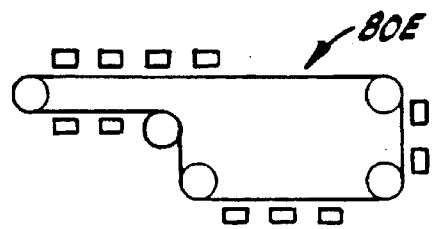

FIG. 26 depicts still another alternative in-line system 80D that uses an endless belt or conveyor 93D. In this system, the substrates can be supported on the belt 93D by gravity, as in FIG. 18. Alternatively, the substrates can be secured to the belt, in which case the belt may be oriented on edge or in essentially any other desired orientation. The endless belt or conveyor 93D is mounted on rollers, typically a combination of drive and idler rollers, for reversible traversal past banks 107 and/or 108 of selected combinations of deposition sources and reaction sources, located on opposite sides of the belt. As in the rotary system depicted, for example, in FIG. 1, parts can be cycled past the zones 107 or 108 as many times as required to build up the necessary number of layers of one or of different materials. Also, as suggested by the arrangement 80E, FIG. 27, the conveyor belt and associated deposition and reaction devices can be arranged in essentially an unlimited number of configurations, determined and limited only by system requirements.

Figure 28:
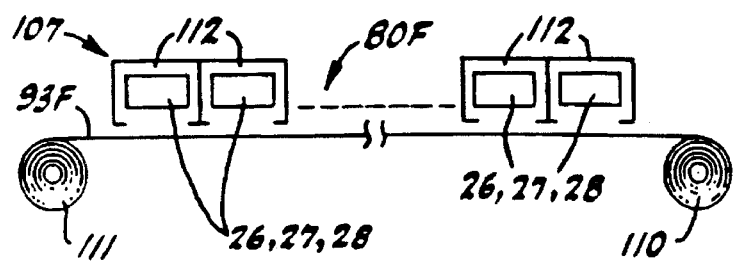
FIG. 28 depicts schematically an alternative in-line system which combines roll or web coating technology with in-line transport technology.

FIG. 28 depicts another alternative in-line system 80F, which combines roll coating technology with in-line transport technology. Specifically, system 80F comprises unwind and take-up rolls 111 and 110 at opposite ends of the associated chamber for, preferably, reversibly unwinding and taking up a roll or web 93F. Banks such as 107 and/or 108 of deposition and reaction devices can be located on one or both sides of the roll and ganged together to form a long in-line machine. Thus, by way of illustration, FIG. 28 depicts a bank 107 comprising alternating deposition devices such as 26, 27 and reaction devices such as 28 located in adjacent chambers 112. Alternatively, the devices can be arranged in any geometry that follows the path of the web.

Please note, as in the web coater 70, FIG. 15, in system 80F substrates may be mounted on either or both sides of the web and/or the web itself may be the substrate which is coated. As is true of the system 80D of FIG. 26, the web 93F can be oriented either horizontally or vertically or at any position therebetween. When the coating design requires the formation of several layers, preferably the substrates are coated during web traversal in both directions. Alternatively, the rolls 109, 110 can be operated to repetitively traverse the roll in a selected direction past the deposition and reaction stations for coating, then rewound and traversed a second time in the same direction to form another layer.

E. Alternative Deposition Sources and Associated System Arrangements

1. Rotating Magnetron Cathode

Figure 29:
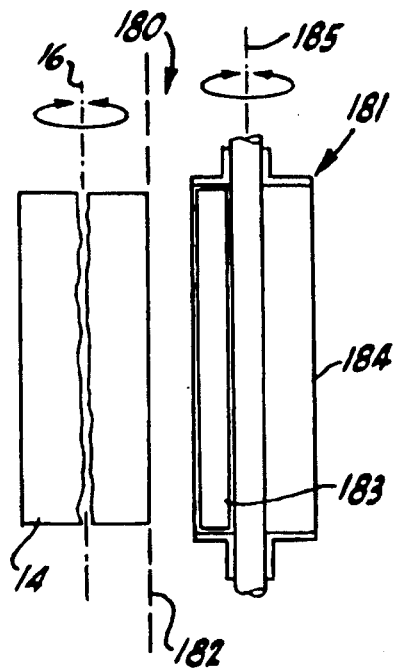
FIGS. 29 and 30 depict schematically an alternative deposition source arrangement which employs a cylindrical rotating magnetron device.

FIG. 29 depicts an arrangement 180 in which one or more of the deposition devices 26, 27 is a rotatable magnetron cathode device 181 such as the C-MAG™ device which is available commercially from AIRCO Coating Technology of Fairfield, Calif. A typical rotational speed for such a device is about 30 rpm. The device can be used for coating either the illustrated drum 14 or, optionally, the web or conveyor 182 illustrated schematically in FIG. 28.

Illustratively, the rotating magnetron cathode device 181 is an adaptation of the planar magnetron device 30, FIGS. 4 and 5, which uses a tubular rotating target. The device 181 comprises a stationary internal linear magnet assembly 183, which defines a race-track shaped magnetic field, and a rotatable cylindrical target 184 which rotates about associated axis 185. The target 184 is a cylinder of target material or a cylinder on which target material is coated, as by plasma spraying. Typically, the device axis 185 is parallel to the drum axis 16.

Rotating cylindrical magnetron devices such as the illustrated device 181 have the advantage of relatively high target material utilization, from about 15/20 percent to about 80/90 percent and, thus, relatively low material costs. Also, such devices have the potential for reduced target poisoning, enhanced source stability and increased power density.

Please note, as suggested above, the deposition devices 181 and the other deposition devices described herein can be positioned along the circumference of the drum 14 (or inside drum 14 or along a web or conveyor 182 or other substrate or substrate support), either alone or with a multiplicity of such devices or in combination with other types of deposition devices described in this application, and with one or more of the various reaction devices described in this application.

Figure 30:
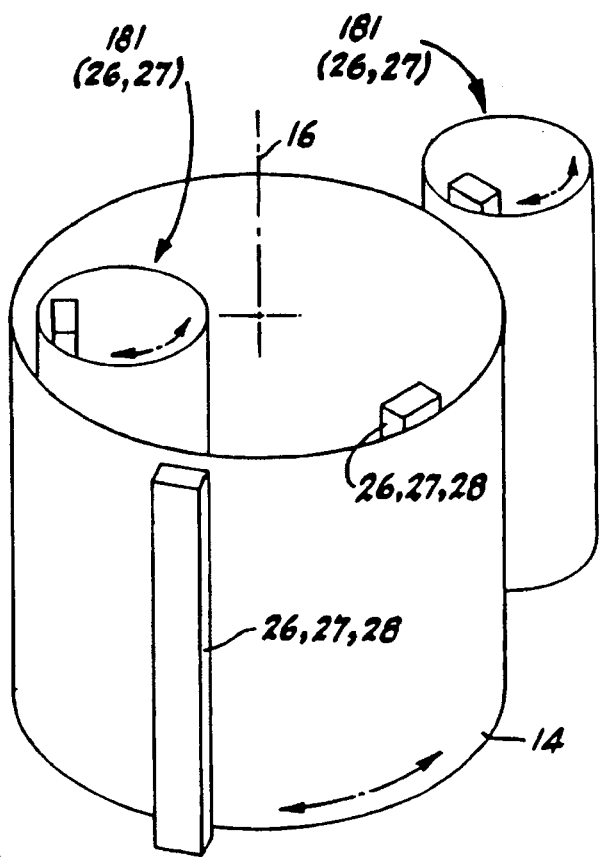

FIG. 30 schematically illustrates one of the above suggested system combinations, in which C-MAG™ or similar devices 181 are positioned both inside and outside a double rotational planetary gear substrate carrier system 25, along with the associated reaction devices 28.

2. Sputter Gun

Figure 31:
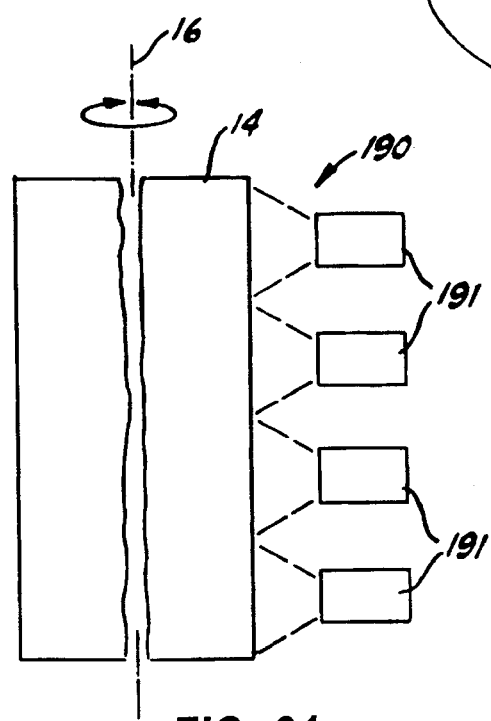
FIG. 31 schematically depicts another alternative deposition source arrangement, in the form of point source sputtering guns or S-guns.

FIG. 31 schematically depicts still another alternative deposition source arrangement, 190, which incorporates a so-called point source sputtering gun or S-gun 191 or, preferably, a plurality or multiplicity of such sputter guns 191. The sputter gun(s) 191 can be any of several commercially available sputter guns available from VacTec; Balzers; U.S., Inc. and other suppliers. Preferably, the sputter guns 191 are aligned along the axis 16 of and adjacent to the associated drum 14. Alternatively, and as discussed above, the devices 191 can be used with a web or an in-line conveyor or other substrate or substrate transport. The source 191 has a localized gas pressure that allows it to be used as a sputter source, but it coats somewhat similarly to a thermal source and can be located remote in the associated vacuum chamber in the manner of an evaporation source and operated as a remote sputtering device.

3. Thermal Evaporation Sources a. Resistance-Heated Source

Figure 32:
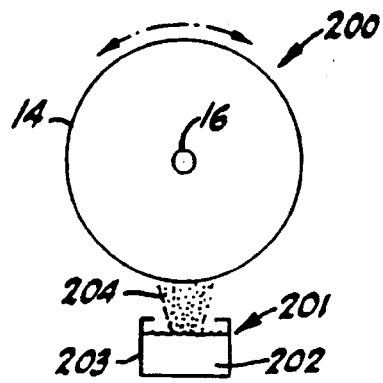
FIGS. 32–35 schematically depict alternative embodiments of thermal evaporation deposition sources, i.e., systems which employ resistance heating (FIG. 32), electron beam heating (FIG. 33), and laser heating (FIG. 34), as well as a centrifugal force, side mount crucible arrangement (FIG. 35)

FIG. 32 schematically illustrates an alternative sputter source arrangement 200 which uses a standard thermal evaporation source 201 in conjunction with the horizontal-axis, single or double rotation drum-type substrate carrier 14. In operation, source material 202 in crucible 203 is evaporated by conventional means such as a resistance heater (not shown) so that the vaporized material 204 is deposited on substrates supported on the drum 14.

b. Electron Beam-Heated Source

Figure 33:
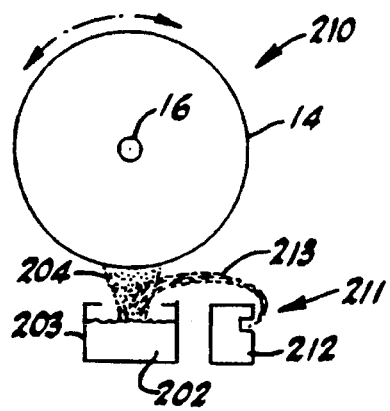

FIG. 33 schematically illustrates an electron beam alternative 210 to the resistance heating arrangement 200, FIG. 32. Here, the system includes a source 212 of electrons, such as a standard, commercially available high voltage electron-beam gun. The electron gun 212 generates a beam 213 of electrons which are directed into the crucible 203, for example, using conventional control means such as a magnetic field (not shown), for evaporating the source material 202. An electron-beam heating arrangement is described in commonly assigned Temple, Seddon et al U.S. Pat. 4,777,908, which is incorporated by reference in its entirety. Also, an improved electron beam heated, plasma plating arrangement described in pending, commonly assigned Temple, Seddon U.S. patent application Ser. No. 312,527, filed Feb. 17, 1989, uses a capped/constant anode crucible, which provides improved electrical circuit continuity and improved plating performance. This Temple, Seddon application is also incorporated by reference.

c. Laser-Heated Source

Figure 34:
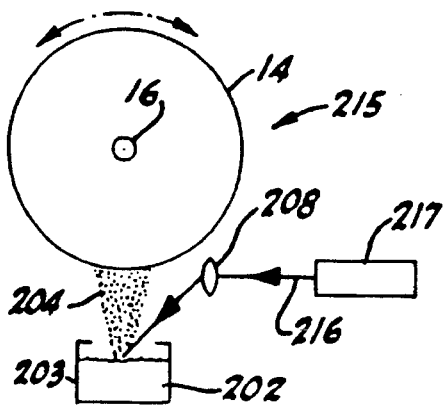

FIG. 34 schematically depicts still another alternative thermal evaporation arrangement 215. Here, the source material 202 is evaporated by a laser beam 216 and, typically, an optics control system 208 of lenses and/or other suitable control elements are used to direct the coherent beam 216 from laser 217 onto the source material 202.

d. Centrifugal Force System

Figure 35:
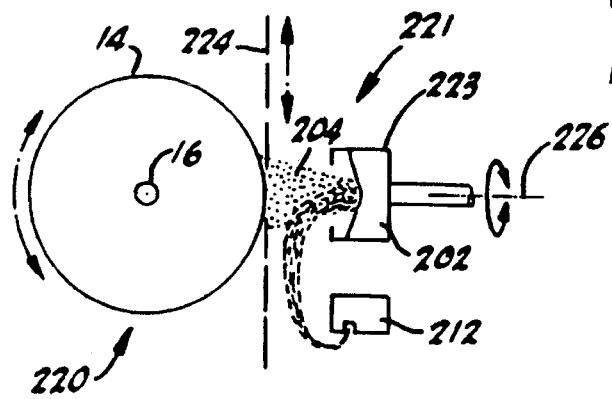

FIG. 35 depicts a thermal evaporation arrangement 220 in which a centrifugal force side mount crucible 223 is mounted horizontally for rotation about axis 226 by motive means (not shown). A source such as the illustrated electron beam gun 212 or a laser is used to heat the source material 202, which is expelled laterally toward substrates mounted on horizontal drum 14 or vertically translatable carrier 224, etc. The centrifugal force generated by the rotation of the crucible 223 confines the molten pool of material within the crucible.

Please note that the evaporation sources (resistive-heated, E-beams, and laser-heated sources) are more conveniently implemented in a horizontal axis drum configuration, but horizontal coating versions have been used. Also, like the S-gun 191, above, multiple sources, such as for example, a linear array of sources, are preferred for large coating systems.

e. Plasma Plating and Associated Deposition System

Figure 36:
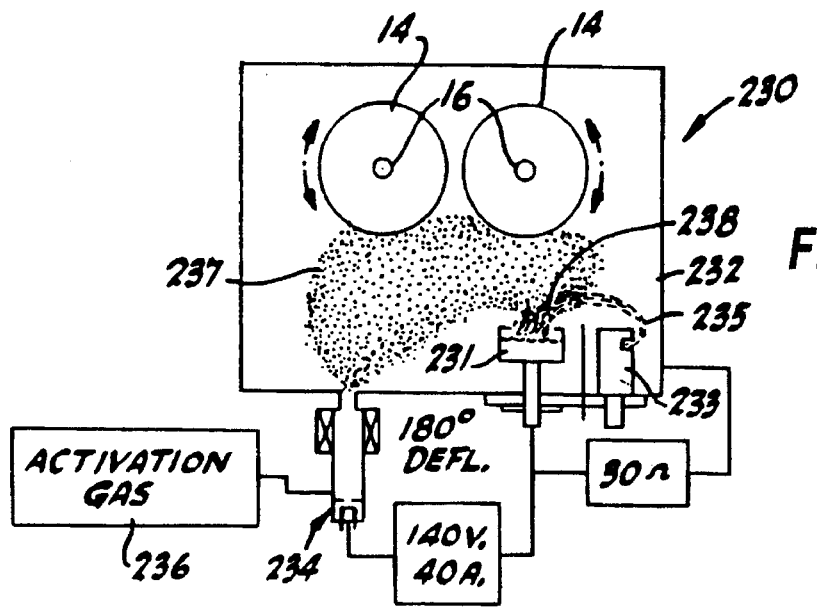
FIG. 36 depicts a modified rotary version of the plasma plating system disclosed in Temple et al U.S. Pat. No. 4,777,908.

FIG. 36 depicts a modified, rotary version 230 of the plasma plating system disclosed in commonly assigned co-pending U.S. patent application Ser. No. 202,830, filed Jun. 3, 1988, in the name of Temple, Seddon et al which is a division of commonly assigned Temple, Seddon et al U.S. Pat. No. 4,777,908. The '908 patent and the application Ser. No. 202,830, are hereby incorporated by reference in their entirety. The incorporated Temple et al system includes an electrically conductive crucible 231 which is positioned within the vacuum chamber 232 and is electrically insulated therefrom, but with a low resistance electrical connection therebetween. A high voltage electron beam source 233 is positioned within the vacuum chamber in the vicinity of the crucible 231 and includes a high voltage electron gun and a deflection magnet system (not shown) arranged for bending the electron beam 235 from the gun into the crucible for evaporating the source material therein. The magnet system also forms a magnetic field in the region above the crucible. A low voltage, high current plasma source including a separate plasma generating chamber 234 produces an intense first plasma in the plasma generating chamber using a selected activation gas species from a source 236 and this plasma is injected into the vacuum chamber 232. Also, the plasma source is electrically interconnected with the crucible to permit current flow between. Illustratively, the chamber incorporates one or more rotatable horizontal drum substrate carriers 14—14, thereby combining the high rate plasma plating capability of the incorporated Temple et al system with the uniformity and other advantages provided by rotary substrate transport. In addition, the incorporated plasma plating approach is adaptable to the in-line, disk and other transport systems which are described herein.

Using the above-described arrangement, the plasma source fills the vacuum chamber with a generally distributed plasma 237 which co-acts with the magnetic field above the crucible 231 and the evaporant material leaving the crucible 231 to form an intense second plasma 238 in the region above the crucible, thereby activating the evaporant material passing through the region for uniform deposition on the substrates mounted on the single axis or double axis rotary transport system. Thus, using the described rotary transport plasma plating scheme, thin films of various metals, refractory metals, metal oxides, etc., can be vacuum deposited uniformly and at high rate on the substrates.

F. Alternative Reaction Sources and Associated System Arrangements

1. Altered Inverse Linear Magnetron Ion Guns

Figure 37A:
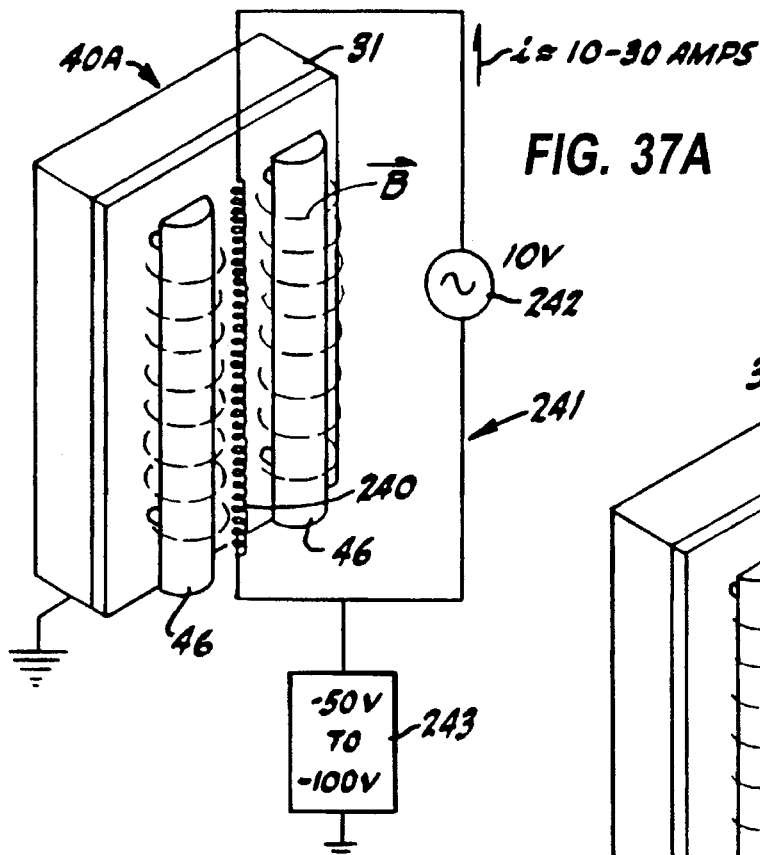
FIGS. 37A and 37B disclose modified embodiments of the inverse linear magnetron ion source gun of FIGS. 6 and 7 which incorporate, respectively, a thermionic electron emission system and a hollow cathode emission system, for providing independent, self-starting, operation and enhanced stability.
Figure 37B:
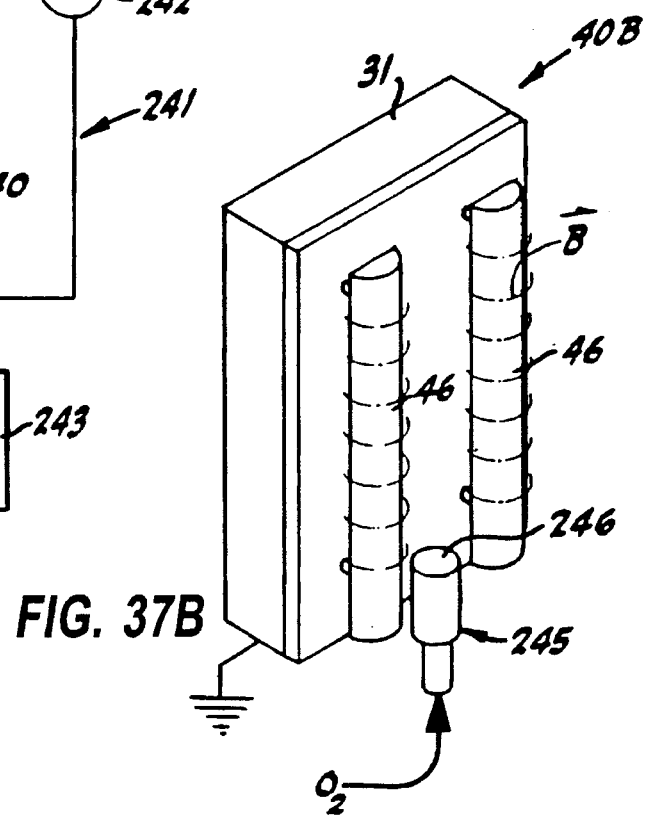

Understanding the problems solved by, and the advantages of, the altered inverse linear magnetron ion guns 40A and 40B depicted in FIGS. 37A and 37B may be aided by a review of the key aspects of the coating system depicted in FIG. 1 and of the above-discussed application of inverse linear magnetron ion gun 40 thereto.

The FIG. 1 vacuum coating chamber is separated into two regions, a metal sputtering zone characterized by a high partial pressure of argon as well as a high metal sputtering rate, and an independent reaction zone containing a high partial pressure of reactive gas along with an ionizing device to enhance reactivity. The substrates are alternated between the two zones on a rotating drum spinning with sufficient velocity to deposit only a few monolayers of metallic material during each pass. Using this technique, optical thin films can be deposited at high rates and with none of the target reaction instabilities associated with conventional reactive sputtering as this technology is known to us.

The above-described approach uses two types of ion guns which generate sufficient plasma density (2–10 amps output current) to fully react the metal films: a standard magnetron target 30 (FIGS. 4 and 5) sputtering in a low rate poisoned mode and a high current, low energy, inverse linear magnetron ion gun 40 (FIGS. 6 and 7). Of the two reaction schemes, the inverse linear magnetron ion gun 40 is preferred because it provides kinetic energy to the ions which allows the drum rotational speed to be slowed and/or the metal sputtering rate to be increased. It has been known that ions with kinetic energies in the 100 eV range can penetrate and react thin metallic films to depths up to three monolayers, and the linear magnetron source 40 provides energy sufficient to this purpose. In contrast, reactive gas ions without this kinetic energy can react only one or two monolayers.

Despite these advantages of the ion gun 40, like everything in an imperfect world, both of the above-described two ion guns have areas where improvement is possible. In the case of the standard magnetron ion gun 30 (FIGS. 4 and 5), the magnetron operates in a relatively low rate poisoned mode which has some potential for arcing at high current densities and contaminating the deposited growing film. Moreover, the poisoned magnetron ionizes a relatively few percent of the reactive gas and provides no means to generate atomic reactive species or reactive products such as monatomic oxygen or ozone, nor does this device impart any kinetic energy to the ions.

As described above, the inverse linear magnetron ion gun 40 (FIGS. 6 and 7) is not self starting in that it depends on an auxiliary plasma created by the deposition device, i.e., on an existing plasma, to provide electrons for initial ignition and stable operation. As a consequence, operating characteristics of the ion gun such as anode voltage are a function of the existing plasma densities. If the auxiliary plasma is extinguished, the ion gun voltage can rise by a factor of as much as three to five. Also, the current output of the linear magnetron gun is limited due to arcing at higher current densities and due to electron deficiencies in the plasma. Such arcing could introduce contaminants, pinholes and absorption in the growing optical thin film. Moreover, the anodes in the inverse linear magnetron ion gun are exposed to the plasma and can become coated by scattered sputtered material. The anodes become hot due to electron heating; re-radiated energy can then provide a significant heat load on the chamber and substrates. Finally, the closed electrical circuit for the source may be somewhat hard to define because the magnetron target itself and the chamber walls can serve as cathodes to complete the circuit.

The altered inverse linear magnetron ion gun devices 40A, FIG. 37A, and 40B, FIG. 37B, are self-starting and eliminate the above difficulties by generating and maintaining their own independent, dedicated, high power stable auxiliary plasma. Key requirements for achieving these design goals are the ability to (1) generate a plasma local to the ion gun and (2) provide an electric current into the plasma equal to the ion gun current. Thermionic electron emission devices, cold cathode discharge devices and arc source devices such as that depicted in the incorporated Temple, Seddon et al patent U.S. Pat. No. 4,777,908, and Temple, Seddon et al patent applications can be used. These devices are representative of a class of successful sources that emit electrodes and act as a cathode to the ion gun. The Temple, Seddon et al patent and the Temple, Seddon et al patent applications are incorporated by reference.

Referring to FIG. 37A, the thermionic electron emission system 40A improves the basic inverse linear magnetron ion gun 40 depicted in FIGS. 6 and 7 by positioning a thermionic electron emission device such as a tungsten or tantalum filament 240 sufficiently close to (illustratively, between) the anode bars 46—46 for emitting electrons within the magnetic field $\vec{B}$. The filament 240 is connected to a power supply arrangement 241 comprising an AC signal source 242 of about 10 volts capable of supplying current of about 10–30 amps and a power supply 243 for biasing at about −50 to −100 volts, to heat the filaments sufficiently to provide thermionic emission of electrons. (The current and voltage values are illustrative only, and not limiting.) The power supply 54 (FIGS. 6 and 7) applies positive voltage to the anode bars 46—46 and generates the aforementioned racetrack configuration magnetic field, $\vec{B}$, which is transverse to the electric field E, i.e, $\vec{E} \times \vec{B}$. Due to the crossed electric and magnetic fields, electrons emitted from the filament 240 into the magnetic field are attracted to the anode bars 46—46, but are deflected by the magnetic field into spiral paths about the lines of flux, $\vec{B}$, such that the electron path length is increased, as are the number of ionizing collisions with the reactive gas molecules supplied by the manifold 57—57 (FIGS. 6 and 7). As a consequence, a dense plasma region is formed adjacent the anode bars 46—46 and a resulting high number density of reactive gas ions are accelerated by the potential between the anode bars and the substrate toward the substrate. Referring now to FIG. 37B, the altered inverse linear magnetron ion gun system 40B incorporates an electron source 245 selected from a hollow cathode device and the arc source of the incorporated Temple et al patent and applications. The hollow cathode device contains material such as tantalum which emits electrons via secondary emission, and is biased to a sufficiently high voltage to provide secondary electrons and supply the desired concentration of electrons in the reactant gas stream emanating from the outlet 246. Illustratively, oxygen is the reactive gas. Exemplary hollow cathodes include the HC series available from Ion Tech, Inc. of Fort Collins, Colo.

Please note, the operation of the devices 40A and 40B is not particularly sensitive to the placement of the filament 240 or the source 245. That is, operation is effective if the electron generating device is sufficiently close to the device to supply electrons to the fringes of the magnetic field and so that the electrons are attracted to the bars by the associated electric $\vec{E} \times \vec{B}$ field.

2. Point Source Ion Guns

Figure 38:
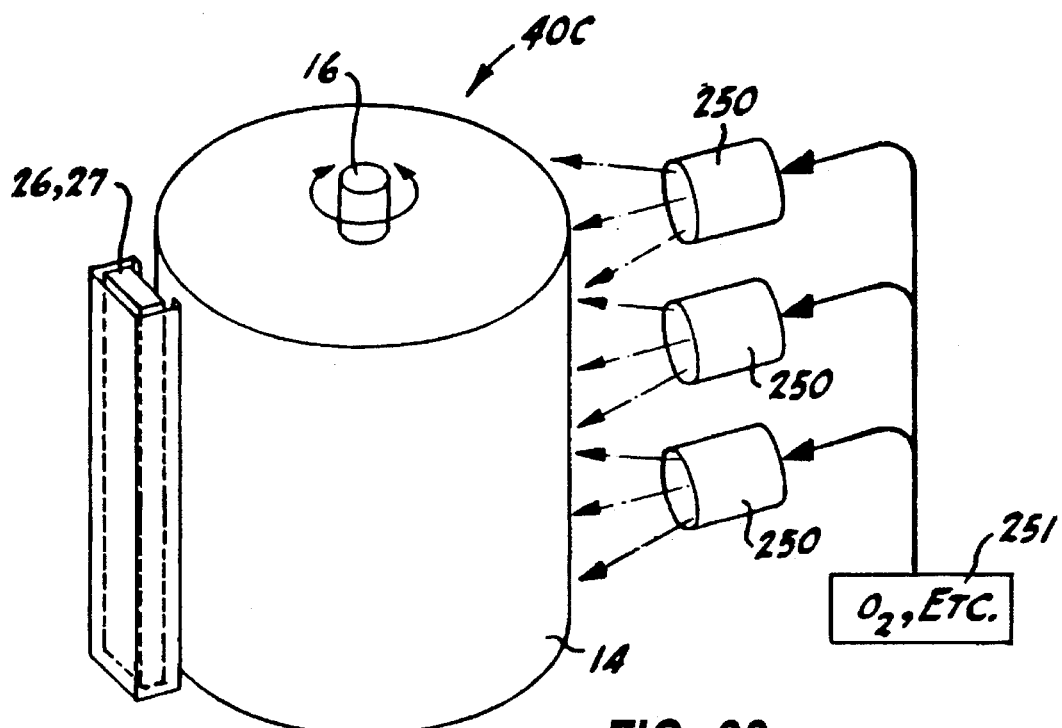
FIG. 38 depicts another alternative ion source system, in the form of one or more so-called point source ion guns.

FIG. 38 depicts still another alternative ion gun system 40C, one employing a so-called point source ion gun 250 and a source 251 of reactive gas such as oxygen. Preferably, a plurality (or multiplicity) of such guns are aligned along the axis of the drum to provide the necessary coverage along that dimension. The gun(s) can be any of several commercially available ion gun sources which have the proper energy and current capacity. One example is the above-mentioned end-Hall Mark I ion source unit available from Commonwealth Scientific Corporation, Alexandria, Va., which has an output current capability of nearly 1–2 amps and supplies ion energies of 50–250 volts.

Unlike the cathode sputtering devices, the uniformity of operation and precise placement of the reaction source is not critical. The key is to define an array that would achieve a saturated reaction. That saturation limit can be achieved by various numbers and arrays of ion source devices.

3. Low Ion Energy Sources

Another approach is to use low ion energy, high power plasma sources to achieve the necessary reaction to form stoichiometric films of controlled density and low stress. Such plasmas react only fractional monolayers and, thus, must be used at relatively high substrate drum rotational speeds or relatively lower metal deposition rates. Microwave, RF, arc and magnetron, plasma-generating systems are applicable to this approach, and to produce cleaner, more stable plasmas. Many of these sources provide much higher ionization efficiencies than even the magnetron ion sources and, as a result, activation of the reactant gases is increased and the corresponding non-energetic reactive gas loads on the chamber and process are reduced.

Also, low energy ion sources may have advantages for the deposition of films such as indium tin oxide (ITO) and low temperature super conductors because they lessen the damage to the film crystal structure caused by impinging kinetic ions. Argon implantation also will be reduced.

a. Microwave Sources

Figure 39:
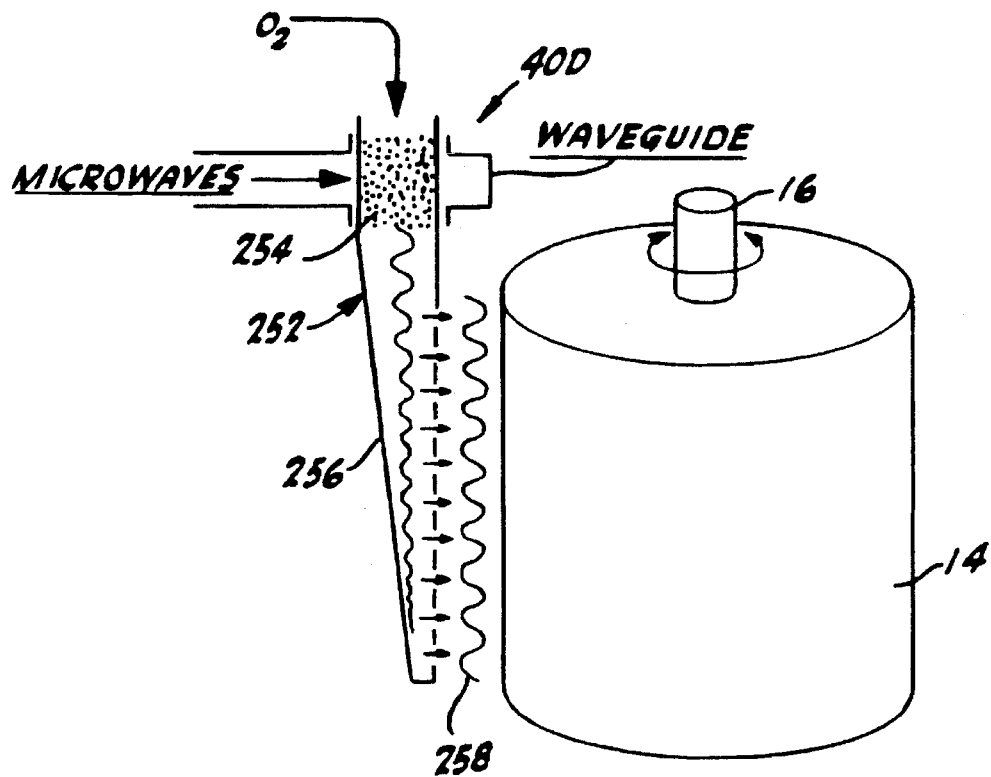
FIG. 39 depicts still another alternative ion source system, in the form of a microwave-driven source.

FIG. 39 depicts a microwave plasma source system 40D of the type alluded to above. In microwave device 252, microwave energy is applied to a reactive gas such as oxygen to produce a plasma 254 containing a high concentration of metal stable ions and free radicals as well as ions suitable for use in chemical vapor deposition, etching and reactive deposition. A manifold 256 is used to extend the microwave discharge axially along the drum 14, as indicated at 258, to provide the required coverage of the rotating drum. Such devices contain no sputtering elements or filaments and, thus, have long operating lives. Also, the microwave discharge can maintain high ionization efficiency at low pressures to reduce the reactive gas loads on the process.

Please note, a number of commercially-available microwave sources can provide from 1 to 1.5 kilowatts of controllable microwave power as a downstream microwave source. Examples include the downstream sources available from ASTEX, Applied Science and Technology, Inc., of Cambridge, Mass., including the model DPH 25 Downstream Plasma Head. Also, commercially available ECR (electron cyclotron resonance) sources, such as the ASTEX ECR Plasma Source, are applicable. The combination of such sources with an appropriate manifold such as 256 provides an effective and clean reaction scheme.

b. Unbalanced Magnetron Source

Figure 40:
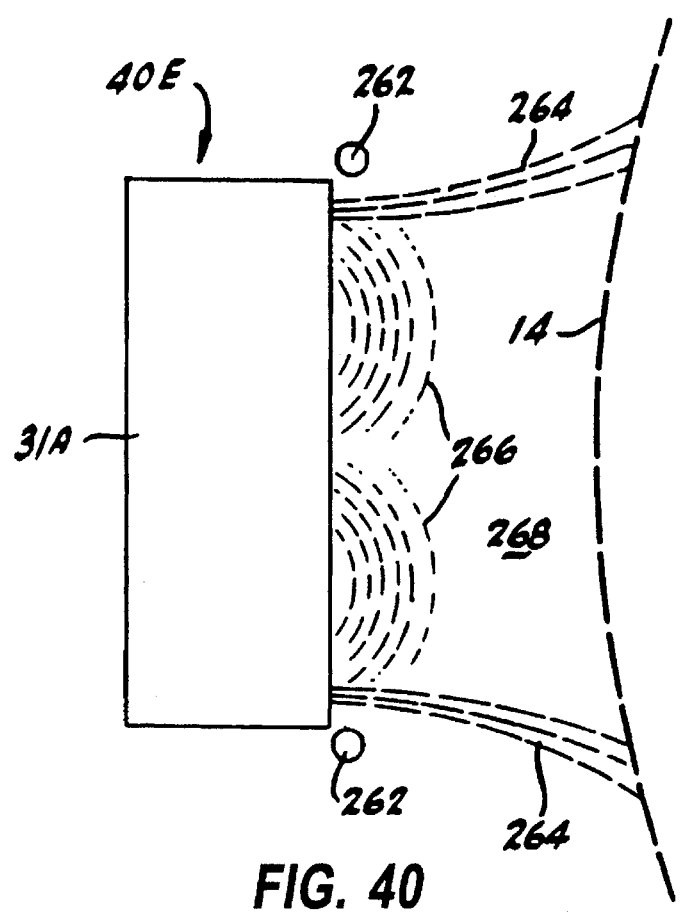
FIG. 40 depicts an alternative geometry in the form of a rotating linear magnetron, multiple target system.

FIG. 40 depicts another low temperature ion source system 40E, one employing an unbalanced magnetron. Here, a standard linear magnetron sputter source has been modified by the addition of auxiliary side magnets 262, which generate weak magnetic fields 264 between the magnetron target and substrate drum and perpendicular to both. This magnetic field is in addition to the conventional racetrack-shaped field 266. This modified linear magnetron sputter source 31A confines the plasma to a localized area 268 between the magnetic fields 264 and, thus, increases the plasma voltage relative to the chamber ground. As a consequence, the overall plasma density is increased and the rotating substrate is bombarded with low energy, ionized, reactive gas species for effecting the desired reaction with the previously deposited film.

c. RF Source

U.S. Pat. No. 4,361,114, issued Nov. 30, 1982, to Gurev, and assigned in common with the present application, discloses a plasma activation RF source (not shown) for use with a conventional evaporation source arrangement. The source comprises a tube of material such as silica which forms a cavity through which oxygen flows. A coil surrounding the tube is driven by RF energy of sufficient power to produce a sustained plasma. The plasma is allowed to enter the chamber through a manifold in such a manner as to produce relative plasma uniformity over the actual length of the associated drum 14. The Gurev U.S. Pat. No. 4,361,114 patent is incorporated by reference in its entirety.

d. Electron Gun

The low voltage electron gun 234, FIG. 36, in the above-incorporated Temple et al plasma plating patent and application can be biased to a separate anode in the chamber to flood the reaction zone with low temperature, high power density ions. Such a plasma arc electron source has been shown to operate at up to 100 amps output current; a large proportion of the oxygen entering the chamber is ionized.

5. Reactivity Enhancers

The reactivity of growing oxide films is increased by the application of enhancers such as ozone and nitrous oxide to the reaction zone via the gas inlet manifolds 57, FIGS. 6 and 7. Ozone generated by commercially-available generators can be liquified and stored and bled into the chamber through the oxygen gas manifold 57. Similarly, nitrous oxide, $N_2O$, can be bled into the gas in the manifold for the purpose of increasing the reactivity.

Also, ultraviolet eximer laser radiation increases the reactivity of silicon films when the photon energy is raised just above the oxygen dissociation energy. Similar effects are predicted for materials such as tantalum and titanium. Consequently, it is anticipated that the application of ultraviolet eximer laser energy to growing films of such materials, for example, through a quartz window in the chamber, alone or in combination with the use of reactive gas enhancers such as those described above and in further combination with any of the above-described reaction sources, will further enhance the reactivity provided by our system.

G. Interchangeable Linear Magnetron Sputtering and Reaction Sources

Referring to FIGS. 5 and 6, the so-called "cat box" (comprising the baffle 32, FIG. 5, or at least the section thereof in front of the electrode assembly 31, plus the manifold 37) and the ion fixture, FIG. 6 (comprising the plate 43, anodes 46 and manifold 57) can be mounted for shuttling back and forth over in front of the electrode assembly 31. This permits selective use of the electrode for sputter deposition and reaction. For example, the cat box assembly and ion fixture assembly can be slidably mounted on rails extending generally parallel to the face of the electrode assembly 31 and on either side thereof, to permit selective positioning of the assemblies over and to the side of the cathode. With the cat box in place over the cathode, the device is used for sputtering, whereas positioning the ion fixture over the electrode assembly permits reactive operation of the device (e.g., oxidation of the sputter deposited film).

Figure 41:
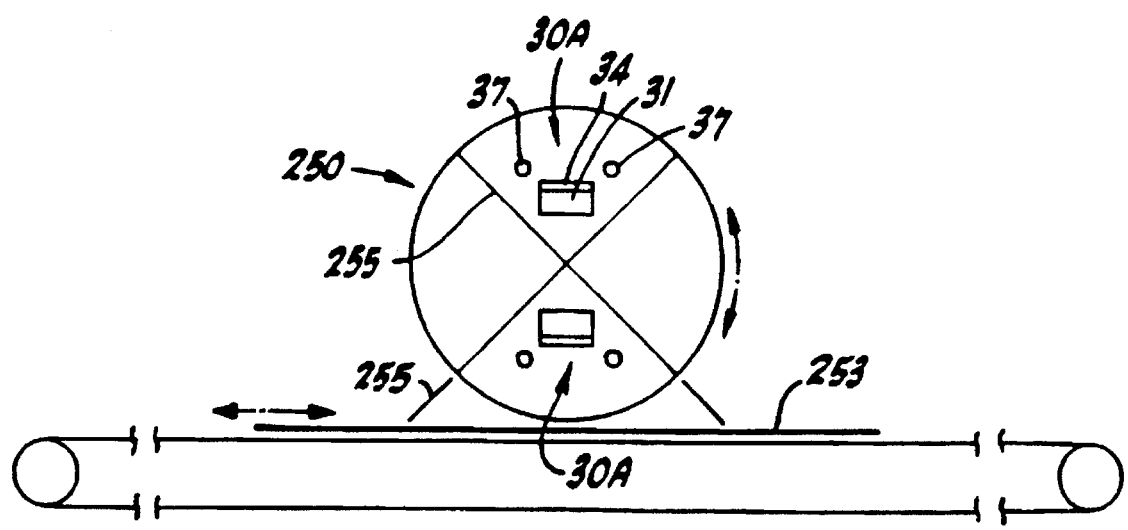
FIG. 41 depicts yet another alternative ion source system, one which is an unbalanced magnetron version of the standard linear magnetron sputter source.

H. Rotatable Linear Magnetron Multiple Target Source and Associated System Configuration FIG. 41 schematically depicts a system in which linear magnetron devices 30 (FIGS. 4 and 5) are adapted to a rotary (preferably multiple target) configuration, thereby providing the ability to rotate the multiple cathode device past the substrates. While this approach is adaptable to various system geometries, its preferred application is coating large workpieces such as architectural glass, using in-line machines of the type disclosed, for example, in FIGS. 22–24.

The exemplary rotating cathode device 250 comprises a cylindrical enclosure or housing 251 having separate compartments. Illustratively, several compartments comprise individual linear magnetron sputtering devices 30A, while others are vacant. Each of the sputtering devices 30A includes cathode assembly 31, target 34, gas inlet manifolds 37 and the other associated tooling discussed relative to FIGS. 4 and 5. Flat substrates 253 may be transported relatively slowly past the device 250 on suitable conveyors such as those shown in FIG. 22.

During operation, the device 250 is rotated past the slowly moving substrates 253, thereby rotating the individual gases and targets past the substrates. The targets are energized (or the associated shutters are opened), while the targets are facing the substrate. Variable length vanes 255 separate the compartments and are selectively moved in and out so as to pass close to the substrate surface and sweep the gas along. Because the gas is at a relatively low pressure, the pump vanes and the enclosure-to-substrate interface do not have to be particularly gas tight. The small amount of escaping gas can be removed by the pumping system or by auxiliary pumps. As there is not much mass to the gases, various available light-weight mechanisms can be used to provide virtual seals at the enclosure/substrate interface and along the edges of the vanes.

I. Examples

The following examples illustrate the ability of our process to deposit multi-layered, optical quality films in large quantities (high throughput) on different substrates, that is, substrates formed of different materials and including curved substrates. The films described in the following examples were all formed using the apparatus depicted in FIGS. 1–3 and, specifically, a drum 14 comprising the double rotational planetary gear arrangement 25 (for tubular or cylindrical substrates) and single rotational mounting positions 15 (for substrates such as sunglass lenses and lamp reflectors). The system used a 29 inch diameter drum rotated here at about 48 rpm, a five-inch wide aperture in the isolation baffle, and a five-inch target width. The linear magnetron cathode 30 was used to sputter deposit various materials and the inverse linear magnetron ion source 40 was used to oxidize the deposited materials.

The examples are characterized by the fact that the products described are required in large quantities, but with a high degree of consistency within any product type and the optical and mechanical properties of multi-layer systems which define the product function must be extremely uniform over the surface of the products.

With these products as examples, it is worth highlighting certain essential differences between our invention and the prior art discussed previously.

Our technique employs distinct separate non-contiguous zones for deposition and reaction. The overall pressure between the zones is low which minimizes arcing and subsequent loss of film thickness control.

The deposition and reaction zones at the periphery of the drum are long and narrow permitting the installation of multiple stations around the circumference of the cylindrical work surface. This is essential if more than one material must be deposited in the same process cycle, which is a requirement in all of the examples that we describe.

In addition to permitting an increased number of stations, the long narrow regular shape of the deposition and reaction zones permits the use of a large number of individual substrates and a large substrate area, with resultant high throughput, because a large number of reaction zones, as well as deposition zones can be positioned about the circumference of the rotating substrate carrier and because all substrates located around the work surface are exposed to the same material flux and plasma conditions. This ensures a very high degree of control of film thickness on the different substrates, which is essential for consistency within a product type.

The lack of a requirement for tight baffling between the deposition zone and substrate carrier permits the coating of substrates having curvature such that this tight baffling would not be practical. For example, it permits the coating of lenses and tubes.

1. Curved Glass "Cold" Mirrors (M16 & M13.25)

Figure 42:
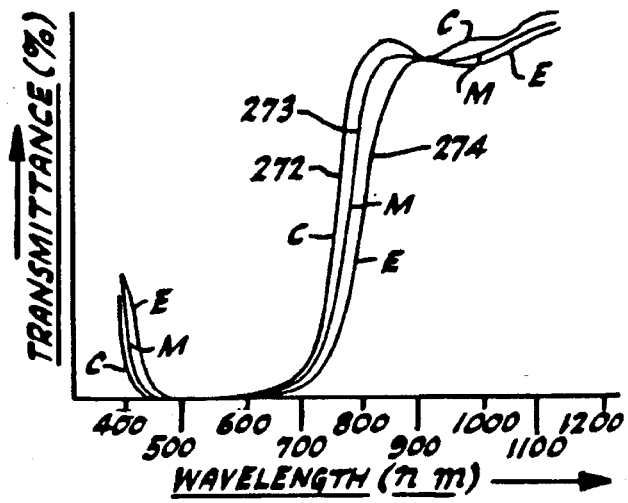
FIGS. 42–47 depict one or both the transmittance and reflectance curves for (a) optical quality films deposited on curved glass mirrors (FIG. 42), glass eyeglass lenses (FIG. 43), plastic eyeglass lenses (FIG. 44), and for (b) anti-reflective coatings on plastic (FIG. 45), yellow headlamp filter coatings (FIG. 46), and mirror coatings on infrared radiant heating lamps (FIG. 47)
Figure 48:
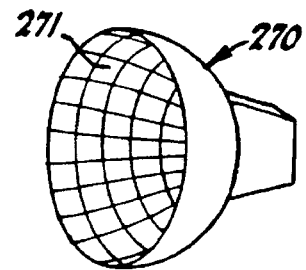
FIG. 48 depicts the type of deep dish glass lamp reflector on which reflected multi-layer oxide coatings having the transmittance characteristics evidenced, e.g., in FIG. 42 were formed using the present invention.

The system shown in FIGS. 1–3 was used in the single rotation mode to form reflective multi-layer oxide coatings comprising alternating layers of titanium dioxide and silicon dioxide on the concave inner surface 271 of glass lamp reflector substrates 270, FIG. 48, using the process of Table 1. See substrate position 15B, FIG. 1. Effectively, we coated the deep dish reflector surface 271 with two materials with precisely controlled uniformity at a high deposition rate. The coatings comprised twenty-one layers, $$\text{substrate} \left| \frac{(H/2\ L\ H/2)^5}{627\ \text{nm}} \quad \frac{(H/2\ L\ H/2)^5}{459\ \text{nm}} \right| \text{ambient,}$$

where L=silicon dioxide and H=titanium dioxide, with the two stacks $(H/2\ L\ H/2)^5$ centered at QWOT (quarter wave optical thicknesses) of 627 nm and 459 nm, respectively. In the industry standard notation used above, each $(H/2\ L\ H/2)^5$ indicates a five-fold repetition of the layer sequence comprising, in order, a one-half QWOT layer of titanium oxide (H/2); a QWOT layer of silicon dioxide (L); and another one-half QWOT layer of titanium oxide (H/2). Referring to FIG. 42, as demonstrated by curve 272, 273 and 274 for the percent transmittance curve as a function of wavelength at the film center, middle, and edge, (C, M, E) respectively, the coatings possessed the desired E/C ratio of 1.05 and otherwise achieved the spectral performance design objective of transmitting infrared light energy, i.e., light of wavelength greater than approximately 700 nm, while reflecting visible energy without color alteration of the bulb light source.

TABLE 1

| Substrate: | Concave Glass |
|---|---|
| Rotary Motion: | Single |
| Material 1: | Titanium to form $TiO_2$ |
| Material 2: | Silicon to form $SiO_2$ |
| Cathode Rate, Material 1 (CR1): | 110 Angstroms/sec (A/s) |
| Cathode Rate, Material 2 (CR2): | 90 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.0 microns |
| Ion Source Operation for Material 1: | 4 amps; 125 sccm $O_2$ |
| Ion Source Operation for Material 2: | 2 amps; 100 sccm $O_2$ |
| Post Operation Bake (after completion of coating): | 550° C. in air one hour |

2. Glass Eyeglass Lenses

Figure 43:
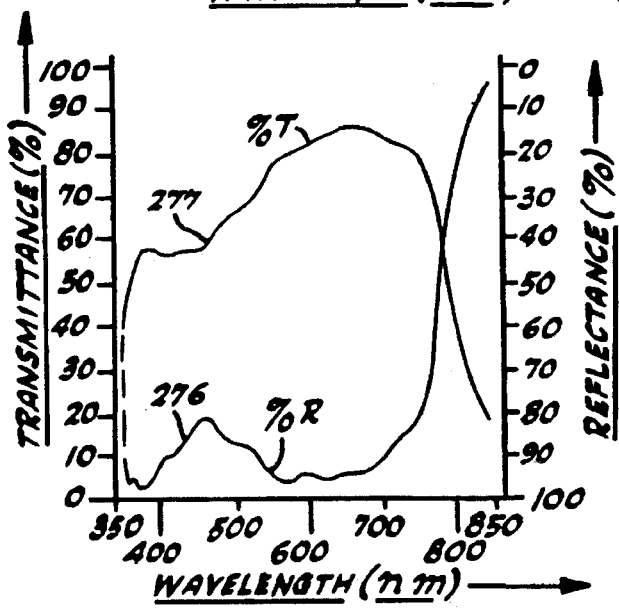

The apparatus described above and depicted in FIGS. 1–3 was also used in the single rotation mode to form a twenty-six layer optical quality coating comprising alternating layers of tantalum pentoxide and silicon dioxide on convex glass lenses using the process parameters of Table 2. As demonstrated by the percent reflectance curve 276 of FIG. 43 and the percent transmittance curve 277, also in FIG. 43, the coatings achieved the spectral performance design goals of providing a rejection band in the near infrared for filtering damaging infrared rays from the eyes as well as a rejection band in the ultraviolet and very high film durability characterized by the standard eraser rub, abrasion resistance test per MIL-C-675. In addition to the eye protecting features of the film, visible light is selectively filtered over the approximate range 400–700 nm by the coating design (layer thicknesses) to achieve different cosmetic coloring without substantially affecting visible light transmittance. This design requires stringent control of the optical thickness of the constituent layers to achieve stringent color reproducibility requirements. Product produced using our invention is a factor of two more uniform than product produced by prior art methods.

TABLE 2

| Substrate: | Glass Sunglass Lenses |
|---|---|
| Rotary Motion: | Single |
| Material 1: | Tantalum to form $Ta_2O_5$ |
| Material 2: | Silicon to form $SiO_2$ |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.5 microns |
| Ion Source Operation for Material 1: | 4 amps; 199 sccm $O_2$ |
| Ion Source Operation for Material 2: | 2 amps; 99 sccm $O_2$ |
| Post Operation Bake: | 450° C. in air one hour |

3. Plastic Eyeglass Lenses

Figure 44:
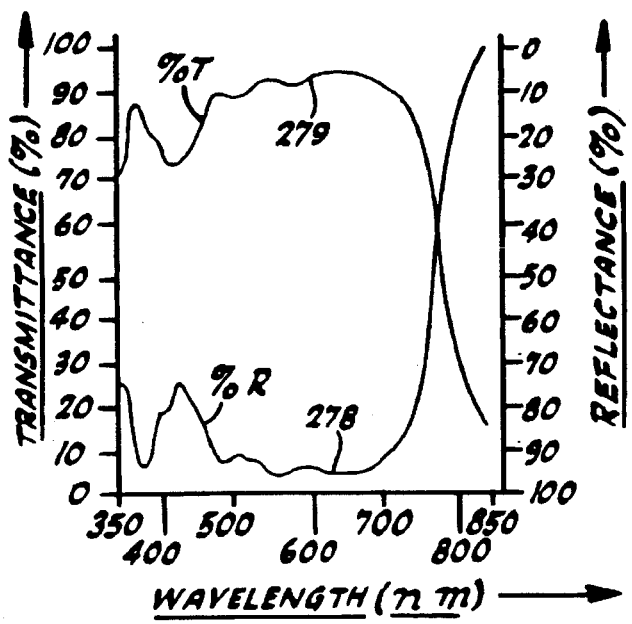

The apparatus depicted in FIGS. 1–3 was used in the single rotation mode with the process of Table 3 to deposit the same twenty-six layer blue filter film described in Example 2 having a rejection band in the near infrared for filtering damaging infrared rays from the eyes as well as a rejection band in the ultraviolet. However, the substrates in this case were plastic sunglass lenses rather than glass lenses. Referring to FIG. 44, as evidenced by the percent reflectance curve 278 and the percent transmittance curve 279, the thin film coatings achieved the optical design objectives discussed in Example No. 2 and the additional objective of deposition on the plastic without melting or softening the plastic, because the process temperature is very low, about 55° C. This demonstrated capability is in distinct contrast to all known prior art vacuum coating processes, for which the formation of multi-layer, durable, optically-transparent coatings on plastic substrates has traditionally been a difficult task. These thin film coatings also passed humidity exposure (MIL-M-13508) and snap tape adhesion tests (MIL-C-675).

TABLE 3

| Substrate: | Plastic Sunglass Lenses |
|---|---|
| Rotary Motion: | Single |
| Material 1: | Tantalum to form $Ta_2O_5$ |
| Material 2: | Silicon to form $SiO_2$ |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 3 KW |
| Material 2 Power: | 5 KW |
| Argon Sputter Pressure: | 2.5 microns |
| Ion Source Operation for Material 1: | 4 amps; 199 sccm $O_2$ |
| Ion Source Operation for Material 2: | 4 amps; 99 sccm $O_2$ |
| Post Operation Bake: | None |

4. Anti-Reflective Coatings for Plastic

Figure 45:
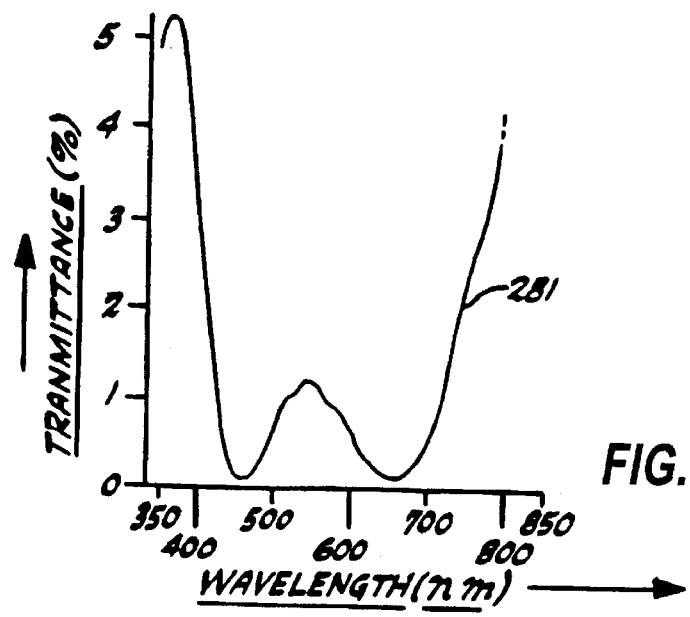

The apparatus described in FIGS. 1–3 was operated in the single rotation mode in accordance with the process shown in Table 4 to form four layer optical films comprising alternating layers of tantalum pentoxide and silicon dioxide on flat and convex curved plastic substrates using a process temperature of approximately 55° C. The films comprised four layers:

substrate | (HLHL) | ambient, where L=silicon dioxide and H=tantalum pentoxide and where the QWOT HLHL were centered, respectively, at 117 nm, 172 nm, 1096 nm and 520 nm. Referring to reflectance curve 281, FIG. 45, the films satisfied the design objectives of providing very low reflectance over the visible wavelength spectrum and depositing very thin (~100 nm thick) layers with repeatability and without melting or softening the plastic.

TABLE 4

| Substrate: | Polycarbonate & Acrylic |
|---|---|
| Rotary Motion: | Single |
| Material 1: | Tantalum to form $Ta_2O_5$ |
| Material 2: | Silicon to form $SiO_2$ |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 3 KW |
| Material 2 Power: | 5 KW |

TABLE 4-continued

| | |
|---|---|
| Argon Sputter Pressure: | 2.5 microns |
| Ion Source Operation for Material 1: | 4 amps; 199 sccm $O_2$ |
| Ion Source Operation for Material 2: | 4 amps; 99 sccm $O_2$ |
| Post Operation Bake: | None |

5. Yellow Headlamp Filter Coating

Figure 46:
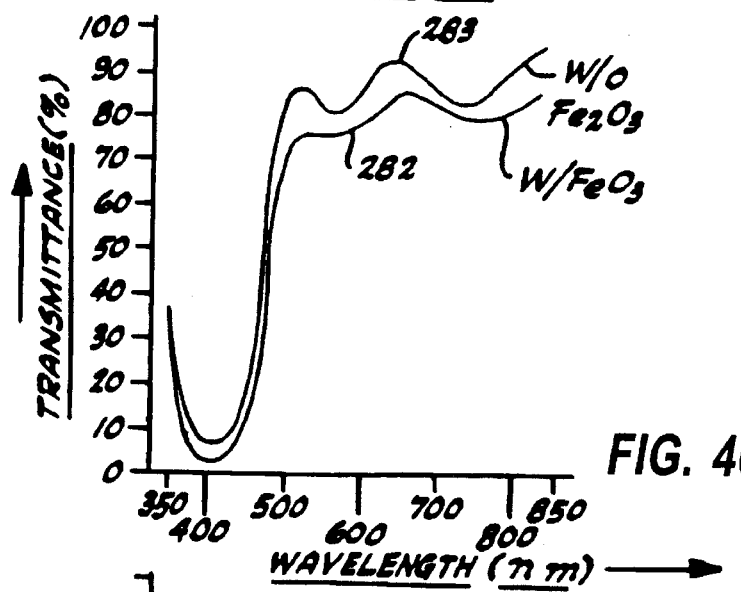

The apparatus depicted in FIGS. 1–3 was also used to deposit fourteen layer films on the quartz envelopes of halogen headlamp bulbs using the double rotation mode and the process of Table 5. The films incorporate three materials, require precise color matching of the multiple materials and require precise control of the constituent thin one-quarter wave layers. As a consequence, the film design is a difficult one to implement. The specific film design was:

substrate ambient | $Fe_2O_3$ (H) (LH)$^6$ | ambient, where L=silicon dioxide and H=tantalum pentoxide and the QWOT $Fe_2O_3$, H and (LH) were centered, respectively, at 14 nm, 10 nm and 430 nm. The films demonstrated the ability to reproducibly deposit a multi-layer blue filter of design $Fe_2O_3$ (H)(LH)$^6$ on the quartz envelope. The $Fe_2O_3$ was used here as a selective absorber. The spectral performance of these films is depicted in FIG. 46. Curve 282 depicts percent transmittance when the $Fe_2O_3$ absorber layer is used; curve 283 describes the performance without the $Fe_2O_3$ layer. FIG. 46 demonstrate that the combination of the multi-layer blue filter and the $Fe_2O_3$ selective absorber transmits yellow light over the range of approximately 500–600 nm and blocks the transmission of blue light at about 450 nm and eliminates the characteristic blue corona associated with high angle reflectance and subsequent transmittance through the glass envelope.

TABLE 5

| | |
|---|---|
| Substrate: | Halogen Lamp Envelopes |
| Rotary Motion: | Double (planetary) |
| Material 1: | Tantalum to form $Ta_2O_5$ |
| Material 2: | Silicon to form $SiO_2$ |
| C.R. 1: | 150 A/s |
| C.R. 2: | 100 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.5 microns |
| Ion Source Operation for Material 1: | 1 amp; 200 sccm $O_2$ |
| Ion Source Operation for Material 2: | 1 amp; 100 sccm $O_2$ |
| Post Operation Bake: | 600° C. in air one hour |

6. Thin Hot Mirror Coatings

Figure 47:
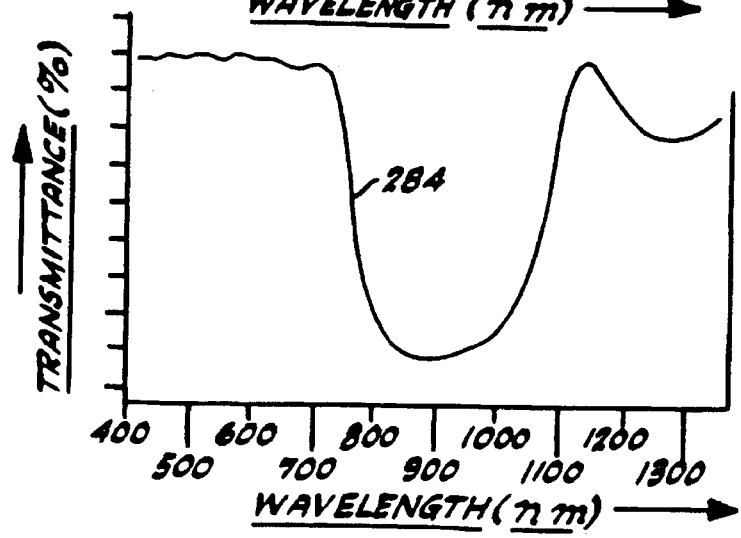

The apparatus depicted in FIGS. 1–3 was operated in the double-rotational mode indicated in Table 6 to form fifteen-layer films on tubular quartz lamp envelopes used in infrared (IR) radiant energy heating lamps. The coatings are termed "thin hot mirror" because they are designed to transmit visible energy while reflecting infrared energy emitted by the internal tungsten halogen filament. The coating leads to lamp power reduction because the infrared energy is geometrically incident on the lamp filament. The energy is used to heat the filament, thereby decreasing the amount of electrical power required to operate the lamp. The specific film design was:

substrate | (L/2 H L/2)$^5$ = 900 nm | ambient where L is silicon dioxide, H is tantalum pentoxide and the QWOT was centered at 900 nm. The spectral performance of these films is depicted in FIG. 47. Curve 284 depicts percent transmittance as a function of wavelength and demonstrates that the hot mirror film or coating transmits visible light over the range of approximately 400–750 nm and reflects IR energy over the approximate range 750–1100 nm back to the filament.

TABLE 6

| | |
|---|---|
| Substrate: | 10 mm Quartz tubes |
| Rotary Motion: | Double (planetary) |
| Material 1: | Tantalum to form $Ta_2O_5$ |
| Material 2: | Silicon to form $SiO_2$ |
| C.R. 1: | 150 A/s |
| C.R. 2: | 100 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.5 microns |
| Ion Source Operation for Material 1: | 2 amps; 199 sccm $O_2$ |
| Ion Source Operation for Material 2: | 2 amps; 99 sccm $O_2$ |
| Post Operation Bake: | 600° C. in air one hour |

Having thus described previous preferred and alternative embodiments of our invention, it will be appreciated that those of usual skill in the art will readily modify and extend the described invention based upon the disclosure here and within the scope of the following claims.

We claim:

1. A coating system, comprising: a vacuum chamber; carrier means mounted within the vacuum chamber and adapted for mounting substrates thereon; coating means comprising at least a first device in the form of a deposition device positioned adjacent the carrier means and adapted for depositing a selected material onto the substrates and at least a second device in the form of an ion source device positioned adjacent the carrier means and adapted for providing a locally intensified plasma between the ion source device and the carrier means for effecting a selected chemical reaction with the selected material; the deposition device and the ion source device spatially separated such that each acts on a different portion of the carrier means; at least one of the carrier means and the coating means being adapted for movement relative to the other of the carrier means and the coating means along a selected path; and the combination of carrier means configuration, deposition device configuration and said relative movement being selected to provide controlled thickness profiles for deposited material.

2. The coating system of claim 1, wherein the carrier means is a rotatable drum or cylinder mounting the substrates thereon for moving the substrates past the deposition device and the ion source device.

3. The coating system of claim 2, wherein the substrate carrier means is translatable along the axis of rotation and, in combination with the rotation, provides a spiral path of movement.

4. The coating system of claim 1, wherein the carrier mounting means comprises a pair of concentric rotatable drums which are translatable along said rotation axis to position the drums at first and second spaced positions proximate to work stations associated with said positions.

5. The coating system of claim 1, wherein the substrate carrier means comprises a rotatable drum having an enclosed atmospheric pressure drum therein mounting said devices.

6. The coating system of claim 1, wherein the substrate carrier mounting means comprises a rotatable drum having mounted about the circumference thereof a plurality of faceted substrate carriers, each said carrier being mounted for rotation along an axis generally parallel to the rotational axis of the drum for selectively presenting the facets to said devices.

7. The coating system of claim 1, the carrier means including a spider assembly comprising at least a pair of spaced arms mounting substrate-carrying cylinders between opposite ends thereof; the coating system further comprising means mounting the spider assembly for rotation about an axis and past the adjacent coating means; and means mounting the cylinders for individual rotation about associated axes generally parallel to said axis.

8. The coating system of claim 1, wherein the carrier means is a movable web or belt-type carrier.

9. The coating system of claim 1, wherein the substrate mounting means comprises: a drum; feed and take-up wind roll means internal to said drum and adapted for traversing a flexible web through an opening in the drum and about the external circumference of the drum continuously or intermittently; and means controlling frictional engagement between the web and the drum to selectively permit traversal of the web relative to the drum.

10. The coating system of claim 9, wherein the control means comprises fingers spanning the peripheral edges of the drum and mounting the web thereon and actuable at said opening for releasing and re-engaging the feed and take-up wind means.

11. The coating system of claim 9, wherein the control means comprises rollers mounted about the periphery of a drum with their axes of rotation generally aligned with the axis of rotation of the drum.

12. The coating system of claim 1, further comprising a deposition device in the form of a rotatable cylinder comprising at least a plurality of peripherally positioned linear magnetron-enhanced deposition devices.

13. The coating system of claim 12, wherein the carrier means is substantially flat and adapted for translational movement.

14. The coating system of claim 1, wherein: said path is circular and the carrier means is substantially flat and is adapted for movement along said path; and the carrier means further comprising means mounting the substrates thereto for movement transverse to said path.

15. The apparatus of claim 1 wherein the carrier means is substantially flat.

16. A process for forming films on a substrate comprising:

providing within a vacuum chamber a carrier means having a rotation axis, the carrier means comprising a spider assembly including at least a pair of spaced arms mounting substrate carrying cylinders between opposite ends thereof, the spider assembly being rotatable about the carrier means rotation axis and the cylinders being individually rotatable about associated axes generally parallel to the carrier means rotation axis; providing film deposition devices and ion source plasma generation devices at selected positions about the periphery of the carrier means, the deposition devices and the ion source plasma generation devices arranged such that at least one deposition device and one ion source plasma generation device may be located spatially separated adjacent each cylinder such that each thereof acts on a different portion of the cylinder; and selectively indexing the spider assembly between the selected positions and rotating the cylinders while at the selected positions for selectively depositing at least one predetermined material onto the substrate and effecting a selected chemical reaction with the deposited material at each position as the substrate passes the ion source plasma generation device; the combination of carrier configuration, deposition device configuration and the rotation providing controlled thickness profiles of material deposited on similarly-shaped substrate surfaces.

17. A process for coating a substrate in a vacuum chamber, comprising: mounting the substrate on a carrier; moving the carrier and the mounted substrates past at least a first device in the form of a deposition device positioned adjacent the carrier for depositing a selected material onto the substrate and past a second device for providing a locally intensified plasma between the second device and the carrier to effect a selected chemical reaction with the selected material as the substrate passes the second device; and, during movement of the carrier, simultaneously moving the carrier and the coating means relative to one another along a selected path to provide the same controlled thickness profiles for material deposited on substrates which are similarly-shaped, one to the other, and mounted at different locations on the carrier.

18. Apparatus for depositing an optical coating on a substrate in a vacuum chamber, comprising:

a substrate holder located in said vacuum chamber, said substrate holder being rotatable about an axis generally transverse thereto and including means for supporting the substrate thereon;

at least first and second deposition devices located in the vacuum chamber, for depositing respectively first and second metals;

at least one reactive ion source device located in said vacuum chamber for providing a locally intensified plasma in and of at least one reactive gas between the ion source device and the substrate holder to chemically react with the deposited layer of material; and said deposition devices and said ion source device being located adjacent said substrate holder and spatially separated from each other such that each acts over a separate region of the substrate holder, and said substrate holder, said deposition devices, and said reactive ion source device being arranged such that, when said substrate holder is rotated, the substrates move sequentially past said first and second deposition devices and said reactive ion source device, for depositing a layer of material selected from the first metal and the second metal and completely chemically reacting said layer with the reactive plasma as the substrate passes the ion source device.

19. The apparatus of claim 18, further comprising:

means for activating at least one of said first and second deposition devices and for activating said reactive ion source device such that, when said substrate holder is rotated, a metal layer is deposited on the substrate by said at least one of said first and second deposition devices and the deposited layer is completely converted to a compound of the metal and the reactive gas by said reactive ion source device, whereby when rotation of said substrate holder is continued with simultaneous operation of the at least one of said first and second deposition devices and said reactive ion source device, sequential deposition and reaction of thin metal layers builds up a coating of the compound on the substrate.

20. The apparatus of claim 19, wherein said activating means is adapted for simultaneously activating said first and second deposition devices and said reactive ion source device to build up a ternary layer of a compound including the first and second metals.

21. The apparatus of claim 19, wherein said activating means is adapted for alternately activating said first deposition device and said second deposition device, for forming alternating layers of compounds of the first metal and the second metal.

22. The apparatus of claim 21 wherein said first and second deposition devices are selected from the group consisting of stationary magnetron sources, rotating magnetron sources, point source sputter guns, stationary evaporation sources, centrifugal force rotating evaporation sources, and reactive ion plating sources, and said reactive ion source device is selected from the group consisting of self-starting ion guns, point ion sources, microwave sources, unbalanced magnetron sources, RF sources, and arc sources.

23. The apparatus of claim 22 wherein said first and second deposition devices are stationary magnetron sources and said reactive ion source device is an unbalanced magnetron source, and said first and second stationary magnetron sources are activated in a low reactive gas partial pressure for sputtering in a metal mode and said unbalanced magnetron source is activated in a high reactive gas partial pressure for creating said locally intensified reactive plasma.

24. Apparatus for depositing a multilayer optical interference coating on a substrate, comprising:

a vacuum chamber;

vacuum pump means, connected to said vacuum chamber for creating a vacuum therein;

a substrate holder located in said vacuum chamber, said substrate holder being rotatable about an axis generally normal thereto and including means for supporting the substrate thereon;

at least first and second magnetron sources located in said vacuum chamber, for depositing respectively first and second metals;

means for operating the first and second magnetron sources for selectively depositing the first and second metals;

at least one magnetron enhanced ion source device located in said vacuum chamber for providing locally intensified plasma including a reactive gas between said magnetron enhanced ion source device and said substrate holder; and said first and second magnetron sources and said magnetron enhanced ion source device being located adjacent said substrate holder and spatially separated from each other such that each acts over a separate region of the substrate holder, and said substrate holder, said first and second magnetron sources, and said magnetron enhanced ion source device being arranged such that, when said substrate holder is rotated, the substrate is moved sequentially past said first and second magnetron sources and said magnetron enhanced ion source device for depositing a layer of metal and completely and chemically reacting the layer during a single pass of the substrate past the magnetron enhanced ion source device.

25. The apparatus of claim 24 wherein said first and second magnetron sources are adapted for effecting a low reactive gas partial pressure for sputtering in a metal mode, and said magnetron enhanced ion source device is an unbalanced magnetron source adapted for effecting a high reactive gas partial pressure for creating the locally intensified reactive plasma.

26. Apparatus for depositing a multilayer optical interference coating on a substrate, comprising:

a vacuum chamber;

vacuum pump means, connected to said vacuum chamber for creating a vacuum therein;

a substrate holder located in said vacuum chamber, said substrate holder being rotatable about an axis generally normal thereto and including means for supporting the substrate thereon;

at least one magnetron source located in said vacuum chamber, for depositing a metal on the substrate;

at least one magnetron enhanced ion source device located in said vacuum chamber for providing a locally intensified plasma including a reactive gas between said magnetron enhanced ion source device and said substrate holder; and said magnetron source and said magnetron enhanced ion source device located adjacent said substrate holder and spatially separated such that each acts over a different region of said substrate holder, and said substrate holder, said magnetron source, and said magnetron enhanced ion source device being arranged such that, when said substrate holder is rotated, the substrate is moved sequentially past said magnetron source and said magnetron enhanced ion source device for depositing a metal layer on the substrate and completely reacting the metal layer as the substrate passes said magnetron enhanced ion source device, whereby the metal layer is converted to a compound of the reactive gas.

27. The apparatus of claim 26 wherein said magnetron source is activated in a low reactive gas partial pressure for sputtering in a metal deposition mode, and said magnetron enhanced ion source is an unbalanced magnetron source activated in a high reactive gas partial pressure for creating said locally intensified reactive plasma.

28. The apparatus of claim 27 wherein the substrate holder is substantially flat.

29. The apparatus of claim 27 wherein the substrate holder is substantially disk shaped.

30. The apparatus of claim 26 wherein the substrate holder is substantially flat.

31. The apparatus of claim 26 wherein the substrate holder is substantially disk shaped.

32. A method of forming a layer of a metal compound on a substrate, comprising: supporting the substrate on a substrate holder; providing a magnetron enhanced sputter deposition source for depositing a metal and a plasma generation device for forming a locally intensified plasma including a reactive gas between said plasma generation device and the substrate, said magnetron enhanced sputter deposition source and said plasma generation device located adjacent the substrate holder and spatially separated such that each acts over a different region of the substrate holder; rotating the substrate holder past said magnetron enhanced sputter deposition source for forming at least one monolayer of the metal on the substrate, and through the locally intensified plasma, for sequentially depositing said at least one monolayer of metal on the substrate and completely chemically reacting said monolayer of metal with the reactive gas in the locally intensified plasma before the substrate holder returns to the magnetron-enhanced sputter deposition device, to form a compound of the metal and the reactive gas; and continuing the substrate holder rotation until a layer of the metal compound of a predetermined thickness is built up on the substrates.

33. The method of claim 32, further comprising activating said magnetron enhanced sputter deposition source in a low reactive gas partial pressure for sputtering in a metal deposition mode, and activating said plasma generation device in a high reactive gas partial pressure for creating said locally intensified reactive plasma.

34. A method of forming a layer of a metal compound on a substrate, comprising the steps of:

(a) providing a vacuum chamber including a substrate holder rotatable about an axis transverse thereto, at least one magnetron enhanced deposition source for depositing a metal, and at least one magnetron enhanced ion source device for creating a locally intensified plasma including a reactive gas between the magnetron enhanced ion source and the substrate holder, said magnetron enhanced deposition source and said magnetron enhanced ion source device located adjacent the substrate holder and spatially separated such that each acts on a different region of the substrate holder;

(b) supporting the substrate on said substrate holder, with the substrate, said magnetron enhanced deposition source, and said magnetron enhanced ion source arranged such that, when said substrate holder is rotated, the substrate is moved sequentially past said magnetron enhanced deposition source and said magnetron enhanced ion source device;

(c) activating said magnetron enhanced deposition source and said magnetron enhanced ion source device;

(d) rotating said substrate holder such that the substrate moves sequentially past said activated magnetron enhanced deposition source and said activated magnetron enhanced ion source device, thereby sequentially depositing at least one monolayer of metal on the substrate and reacting said at least one monolayer of metal with the reactive gas to form a compound of the metal and reactive gas as the substrate passes through the locally intensified plasma before the substrate is returned to the region of the magnetron-enhanced deposition source; and (e) continuing the substrate holder rotation until a layer of the metal compound of a predetermined thickness is built up on the substrate.

35. The method of claim 34 wherein said magnetron enhanced deposition source is adapted for effecting a low reactive gas partial pressure for sputtering in a metal deposition mode, and said magnetron enhanced ion source device is an unbalanced magnetron source and is adapted for effecting a high reactive gas partial pressure for creating said locally intensified reactive plasma.

36. The method of claim 35 wherein the substrate holder is substantially flat.

37. The method of claim 35 wherein the substrate holder is substantially disk shaped.

38. The method of claim 34 wherein the substrate holder is substantially flat.

39. The method of claim 34 wherein the substrate holder is substantially disk shaped.

40. Apparatus for depositing a multi-layer optical coating on a plurality of substrates, comprising:

a vacuum chamber;

a substrate holder located in the vacuum chamber, the substrate holder being mounted for rotation about an axis in the vacuum chamber, including a means for receiving, holding and transporting substrates at the surface of the substrate holder;

means adapted for rotating the substrate holder at a selected velocity about the axis past physically spaced work stations, the physically spaced work stations comprising at least two first work stations and at least one second work station, the physically spaced first and second work stations positioned adjacent to the substrate holder in different regions of the vacuum chamber;

at least two magnetron sputter devices positioned at the first work stations adjacent to the substrate holder, each sputter device having a target of selected material for sputter deposition on substrates and wherein the magnetron sputter devices are operated either alternately or simultaneously;

means for selecting the process operating conditions of the magnetron sputter devices for sputter depositing material from a selected sputter device onto substrates being transported by the substrate holder;

at least one magnetron enhanced ion source device positioned at the second work station adjacent to the substrate holder, and including means for providing an oxygen plasma for oxidation of sputter deposited materials;

means for selecting the process operating conditions of the magnetron enhanced ion source device for effecting a desired reaction with the thin layer of sputter deposited material on the substrates; and the substrate holder, the sputter devices, the ions and the ion source device arranged so that, when the substrate holder is rotated at a selected velocity and a selected sputter device is operated, the substrate traverses repeatedly past the sputter devices and the ion source device, depositing the thin layer of material from the selected sputter device onto the substrates during each one of the repeated passes and completely reacting each the thin layer of material in the oxygen plasma at the second work station during each pass of the substrate holder.

41. A process for depositing a multi-layer optical coating on a plurality of substrates, comprising the steps:

(A) continuously rotating a planar array of substrates about an axis perpendicular to the array, repeatedly traversing the array past at least a pair of first stations and a second station; at one of the first stations, sputter coating on the rotating substrates a relatively thin layer of a first metal during a pass of the substrates past the one first station; at the second station, completely oxidizing the relatively thin layer of the first metal on the rotating substrates in an oxygen plasma during said pass of the substrates past the second station; and continuing the deposition and oxidation of the relatively thin layers of the first metal to form a relatively thick first oxide layer of predetermined thickness;

(B) continuously rotating the planar array of substrates about the axis perpendicular to the array, repeatedly traversing the array past the pair of first stations and the second station; at the second of the first stations, sputter coating on the rotating substrates a relatively thin layer of a second metal during a pass of the substrates past the second first station; at the second station, completely oxidizing the relatively thin layer of the second metal on the rotating substrates in an oxygen plasma during said pass of the substrates past the second station; and continuing the deposition and oxidation of the relatively thin layers of the second metal to form a relatively thick second oxide layer of predetermined thickness; and (C) selectively repeating step (A) and step (B) to form a multi-layer optical coating.

42. The process of claim 41, wherein continuous rotation of the array of substrates about the axis is continued between the steps.

* * * * *